(12) United States Patent
Lee et al.

(10) Patent No.: US 11,626,501 B2
(45) Date of Patent: Apr. 11, 2023

(54) SEMICONDUCTOR DEVICE AND METHOD FOR FABRICATING THE SAME

(71) Applicant: Samsung Electronics Co., Ltd., Suwon-si (KR)

(72) Inventors: In Yeal Lee, Seongnam-si (KR); Ju Youn Kim, Suwon-si (KR); Jin-Wook Kim, Hwaseong-si (KR); Ju Hun Park, Seoul (KR); Deok Han Bae, Hwaseong-si (KR); Myung Yoon Um, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 9 days.

(21) Appl. No.: 17/039,083

(22) Filed: Sep. 30, 2020

(65) Prior Publication Data

US 2021/0257474 A1 Aug. 19, 2021

(30) Foreign Application Priority Data

Feb. 17, 2020 (KR) .......................... 10-2020-0018756

(51) Int. Cl.
| | |
|---|---|
| *H01L 29/423* | (2006.01) |
| *H01L 23/528* | (2006.01) |
| *H01L 21/84* | (2006.01) |
| *H01L 27/088* | (2006.01) |
| *H01L 27/108* | (2006.01) |
| *H01L 29/49* | (2006.01) |

(Continued)

(52) U.S. Cl.
CPC .... *H01L 29/4238* (2013.01); *H01L 21/02019* (2013.01); *H01L 21/845* (2013.01); *H01L 23/528* (2013.01); *H01L 23/5226* (2013.01); *H01L 27/0886* (2013.01); *H01L 27/10826* (2013.01); *H01L 27/10879* (2013.01); *H01L 29/495* (2013.01); *Y10S 977/755* (2013.01); *Y10S 977/938* (2013.01)

(58) Field of Classification Search
CPC ........ H01L 27/10826; H01L 27/10879; H01L 27/0886; H01L 29/417791; H01L 29/66795; H01L 2024/13067; H01L 21/823431; H01L 21/845; H01L 29/4238; H01L 29/495; H01L 29/42376; H01L 29/42392; H01L 29/4966; H01L 29/78696; H01L 21/02019; H01L 23/5226; H01L 23/528; H01L 21/76805; H01L 21/76834; H01L 29/665
See application file for complete search history.

(56) References Cited

U.S. PATENT DOCUMENTS

| | | | |
|---|---|---|---|
| 5,132,755 A | * | 7/1992 | Ueno ................... H01L 29/0847 257/E21.166 |
| 8,436,404 B2 | | 5/2013 | Bohr et al. |
| 8,969,930 B2 | | 3/2015 | Yin et al. |

(Continued)

*Primary Examiner* — Galina G Yushina
(74) *Attorney, Agent, or Firm* — Harness, Dickey & Pierce, P.L.C.

(57) ABSTRACT

A semiconductor device includes a substrate, a gate structure on the substrate, and a gate contact in the gate structure. The gate structure includes a gate electrode extending in a first direction and a gate capping pattern on the gate electrode. The gate contact is connected to the gate electrode. The gate electrode includes a protrusion extending along a boundary between the gate contact and the gate capping pattern.

20 Claims, 36 Drawing Sheets

(51) Int. Cl.
    *H01L 23/522*     (2006.01)
    *H01L 21/02*     (2006.01)

(56) References Cited

U.S. PATENT DOCUMENTS

| | | |
|---|---|---|
| 9,029,920 B2 | 5/2015 | Xie et al. |
| 9,236,437 B2 | 1/2016 | Zaleski et al. |
| 9,679,847 B2 | 6/2017 | Zhang |
| 10,121,874 B2 | 11/2018 | Zhang |
| 10,177,241 B2 | 1/2019 | Park et al. |
| 10,388,770 B1 | 8/2019 | Xie et al. |
| 2009/0169919 A1* | 7/2009 | Garcia ................ C23C 14/5806 428/688 |
| 2013/0299996 A1* | 11/2013 | Grivna .............. H01L 29/66727 257/E21.585 |
| 2017/0110549 A1* | 4/2017 | Xie ........................ H01L 29/45 |
| 2020/0035796 A1* | 1/2020 | Lee ..................... H01L 29/7851 |
| 2020/0152518 A1* | 5/2020 | Zang .................... H01L 29/401 |
| 2020/0203352 A1* | 6/2020 | Im ..................... H01L 27/10876 |
| 2021/0202399 A1* | 7/2021 | Chang ............... H01L 21/76802 |

\* cited by examiner

SEMICONDUCTOR DEVICE AND METHOD FOR FABRICATING THE SAME

CROSS REFERENCE TO RELATED APPLICATION

This application claims priority under 35 U.S.C. § 119 to Korean Patent Application No. 10-2020-0018756 filed Feb. 17, 2020, the disclosure of which is incorporated herein in its entirety by reference.

BACKGROUND

1. Field

Inventive concepts relate to a semiconductor device and/or a method for fabricating the same.

2. Related Art

As one of scaling techniques for increasing density of a semiconductor device, a multi-gate transistor, in which a multi-channel active pattern having a fin shape or a nanowire shape (or a silicon body) is formed on a substrate and a gate is formed on a surface of the multi-channel active pattern, has been proposed.

Since such a multi-gate transistor utilizes a three-dimensional channel, it may be scaled. Further, even if a gate length of the multi-gate transistor is not increased, the current control capability may be improved. In addition, it is possible to effectively limit and/or suppress a SCE (short channel effect) in which potential of a channel region is influenced by a drain voltage.

On the other hand, there is a need for research for securing a reduction in capacitance and electrical stability between contacts in the semiconductor device as a pitch size of the semiconductor device decreases.

SUMMARY

Aspects of inventive concepts provide a semiconductor device capable of improving the element performance and reliability by improving alignment between a gate electrode and a gate contact.

Aspects of inventive concepts also provide a method for fabricating a semiconductor device capable of improving the element performance and reliability by improving alignment between a gate electrode and a gate contact.

However, aspects of inventive concepts are not restricted to those set forth above. The above and other aspects of inventive concepts will become more apparent to one of ordinary skill in the art to which inventive concepts pertain by referring to the description of embodiments of inventive concepts given below.

According to example embodiments, a semiconductor device includes a substrate, a gate structure on the substrate, and a gate contact in the gate structure. The gate structure includes a gate electrode extending in a first direction and a gate capping pattern on the gate electrode. The gate contact is connected to the gate electrode. The gate electrode includes a protrusion extending along a boundary between the gate contact and the gate capping pattern.

According to example embodiments, a semiconductor device includes a substrate including an active region and a field region, the substrate including a multi-channel active pattern in the active region, the multi-channel active pattern extending in a first direction; a gate structure intersecting the multi-channel active pattern, the gate structure including a gate electrode extending in a second direction, the gate electrode including a protrusion including an inner wall and an outer wall, the outer wall defined along a periphery of the inner wall; a source/drain pattern on at least one side of the gate structure and connected to the multi-channel active pattern; a gate contact on the active region of the substrate and connected to the gate electrode, at least a part of the gate contact being in a pocket defined by the inner wall of the protrusion of the gate electrode; and a source/drain contact on the active region of the substrate and connected to the source/drain pattern.

According to example embodiments, a semiconductor device includes a substrate; a plurality of nanosheets spaced apart from each other on the substrate, each of the plurality of nanosheets extending in a first direction; a gate structure including a gate electrode that wraps around each of the plurality of nanosheets on the substrate, the gate electrode extending in a second direction, the gate electrode including a protrusion that protrudes in a thickness direction of the substrate, the protrusion of the gate electrode including a first side wall and a second side wall that is opposite the first side wall and directly joins the first side wall, the first side wall of the protrusion of the gate electrode including a curved surface; a source/drain pattern connected to the plurality of nanosheets, the source/drain pattern on at least one side of the gate structure; and a gate contact in the gate structure and connected to the gate electrode, the gate contact being in contact with the first side wall of the protrusion of the gate electrode, the protrusion of the gate electrode covering at least a part of a side wall of the gate contact.

According to example embodiments, a method for fabricating a semiconductor device includes forming a pre-gate electrode on a substrate, forming a gate contact hole in the pre-gate electrode, forming a gate contact that fills at least a part of the gate contact hole; forming a gate electrode, the forming the gate electrode including recessing a part of the pre-gate electrode using the gate contact as a mask; and forming a gate capping pattern on the gate electrode.

BRIEF DESCRIPTION OF THE DRAWINGS

The above and other aspects and features of embodiments of inventive concepts will become more apparent by describing below the attached drawings, in which.

DETAILED DESCRIPTION

Figure 1:
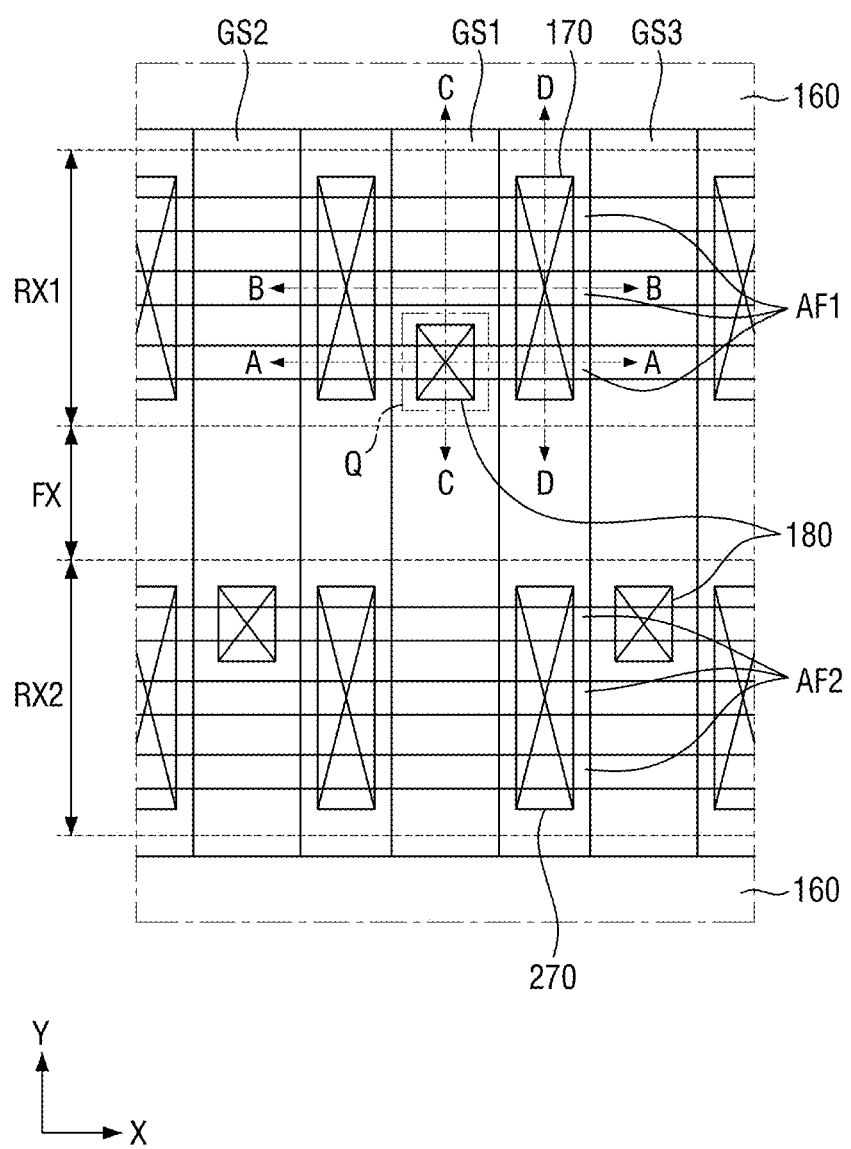
FIG. 1 is an example layout diagram for explaining a semiconductor device according to some embodiments.

In the drawings of the semiconductor device according to some embodiments, although a fin-type transistor (FinFET) including a channel region having a fin-type pattern shape and a transistor including a nanowire or a nanosheet are shown as an example, the embodiments are not limited thereto. The technical ideas of inventive concepts may be applied to a planar transistor. In addition, the technical ideas of inventive concepts may be applied to a transistor based on a two-dimensional material (2D material based FETs) and a heterostructure thereof.

In addition, the semiconductor device according to some embodiments may include a tunneling transistor (tunneling FET) or a three-dimensional (3D) transistor. The semiconductor device according to some embodiments may include a bipolar junction transistor, a lateral double diffusion transistor (LDMOS), and the like.

A semiconductor device according to some embodiments will be explained referring to FIGS. 1 to 7b.

Figure 6:
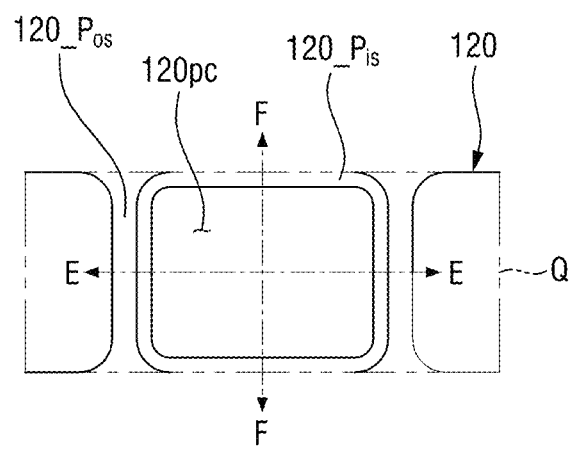
FIG. 6 is a plan view for explaining a gate electrode in a part Q of FIG. 1.
Figure 7A:
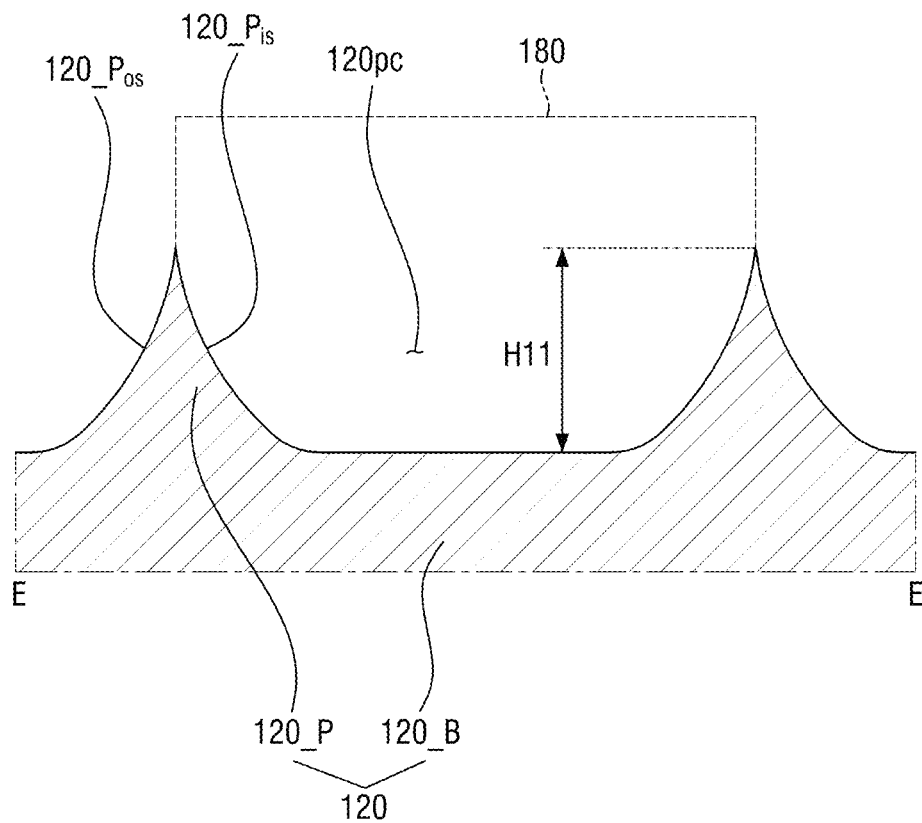
FIGS. 7a and 7b are example cross-sectional views taken along lines E-E and F-F of FIG. 6.
Figure 7B:
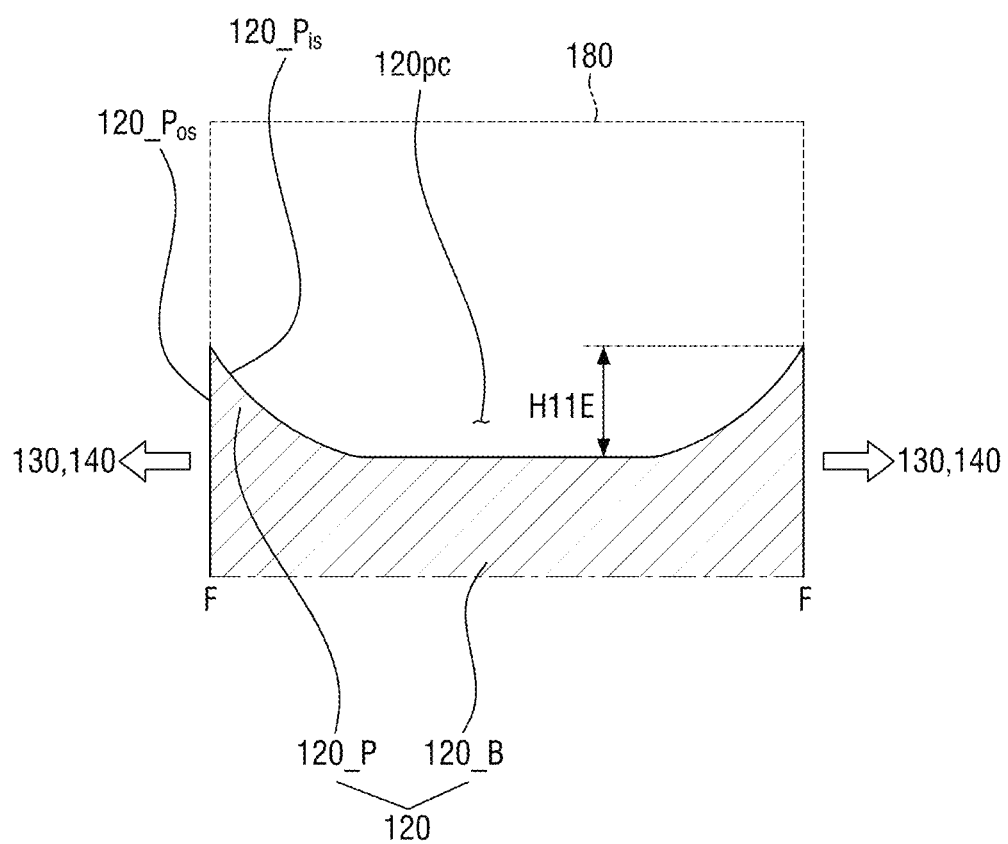

FIG. 1 is an example layout diagram for explaining the semiconductor device according to some embodiments. FIGS. 2 to 5 are cross-sectional views taken along lines A-A, B-B, C-C, and D-D of FIG. 1, respectively. FIG. 6 is a plan view for explaining a gate electrode of a part Q of FIG. 1. FIGS. 7a and 7b are example cross-sectional views taken along lines E-E and F-F of FIG. 6.

For convenience of explanation, FIG. 1 does not show a wiring structure 210. For reference, FIGS. 7a and 7b show only a part of the gate electrode 120.

Referring to FIGS. 1 to 7b, the semiconductor device according to some embodiments may include at least one or more first active patterns AF1, at least one or more second active patterns AF2, at least one or more gate structures GS1, GS2 and GS3, a first source/drain contact 170, a second source/drain contact 270, and a gate contact 180.

The substrate 100 may include a first active region RX1, a second active region RX2, and a field region FX. The field region FX may be formed directly adjacent to the first active region RX1 and the second active region RX2. The field region FX may border the first active region RX1 and the second active region RX2.

The first active region RX1 and the second active region RX2 are spaced apart from each other. The first active region RX1 and the second active region RX2 may be separated by the field region FX.

In other words, an element isolation film may surround periphery of the first active region RX1 and the second active region RX2 spaced apart from each other. At this time, a portion of the element isolation film located between the first active region RX1 and the second active region RX2 may be defined as the field region FX. For example, a portion in which a channel region of a transistor which may be an example of the semiconductor device is formed may be the active region, and a portion which divides the channel region of the transistor formed in the active region may be the field region. Alternatively, the active region may be a portion in which a fin-shaped pattern or nanosheet used as the channel region of the transistor is formed, and the field region may be a region in which the fin-shaped pattern or nanosheet used as the channel region is not formed.

Figure 4A:
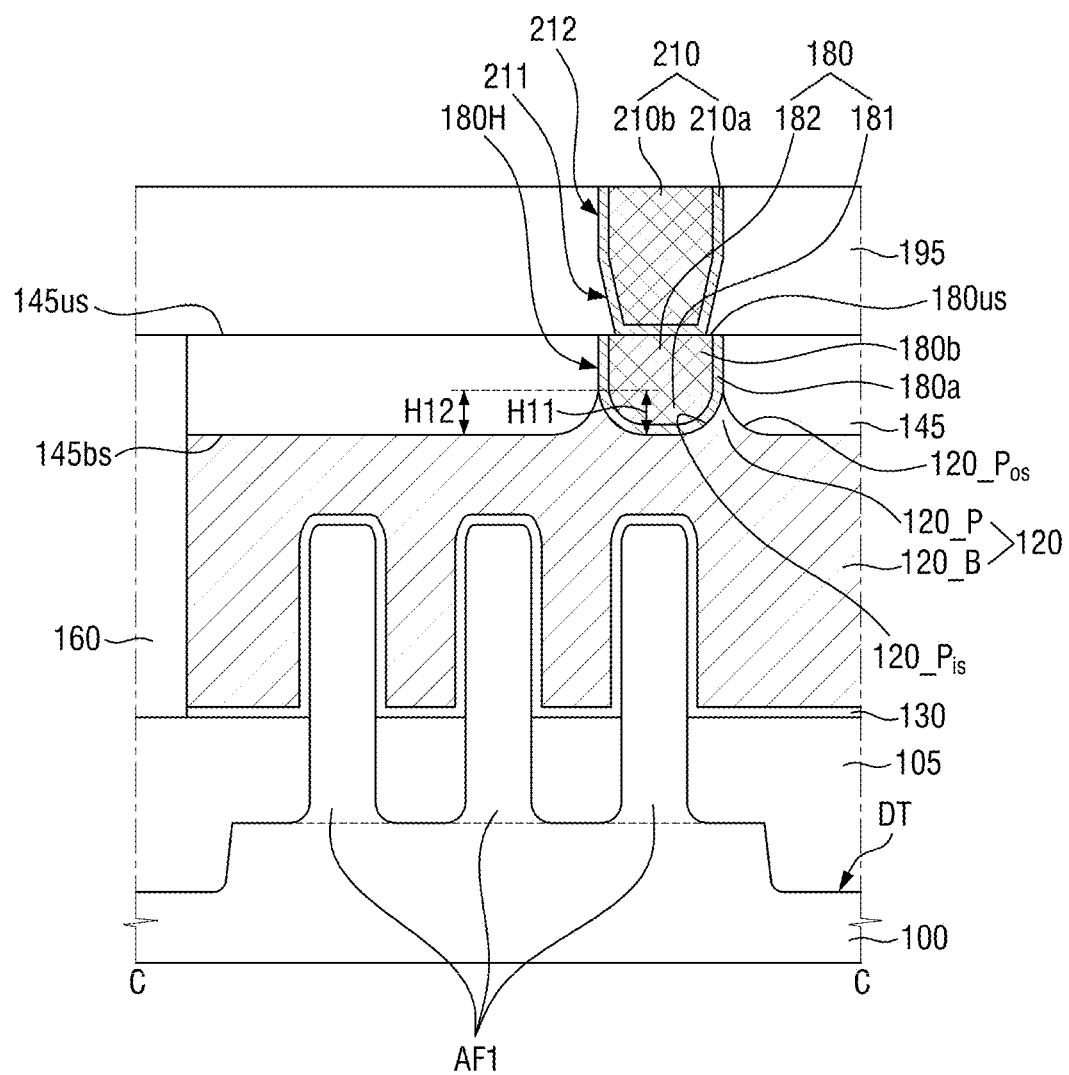
Figure 4B:
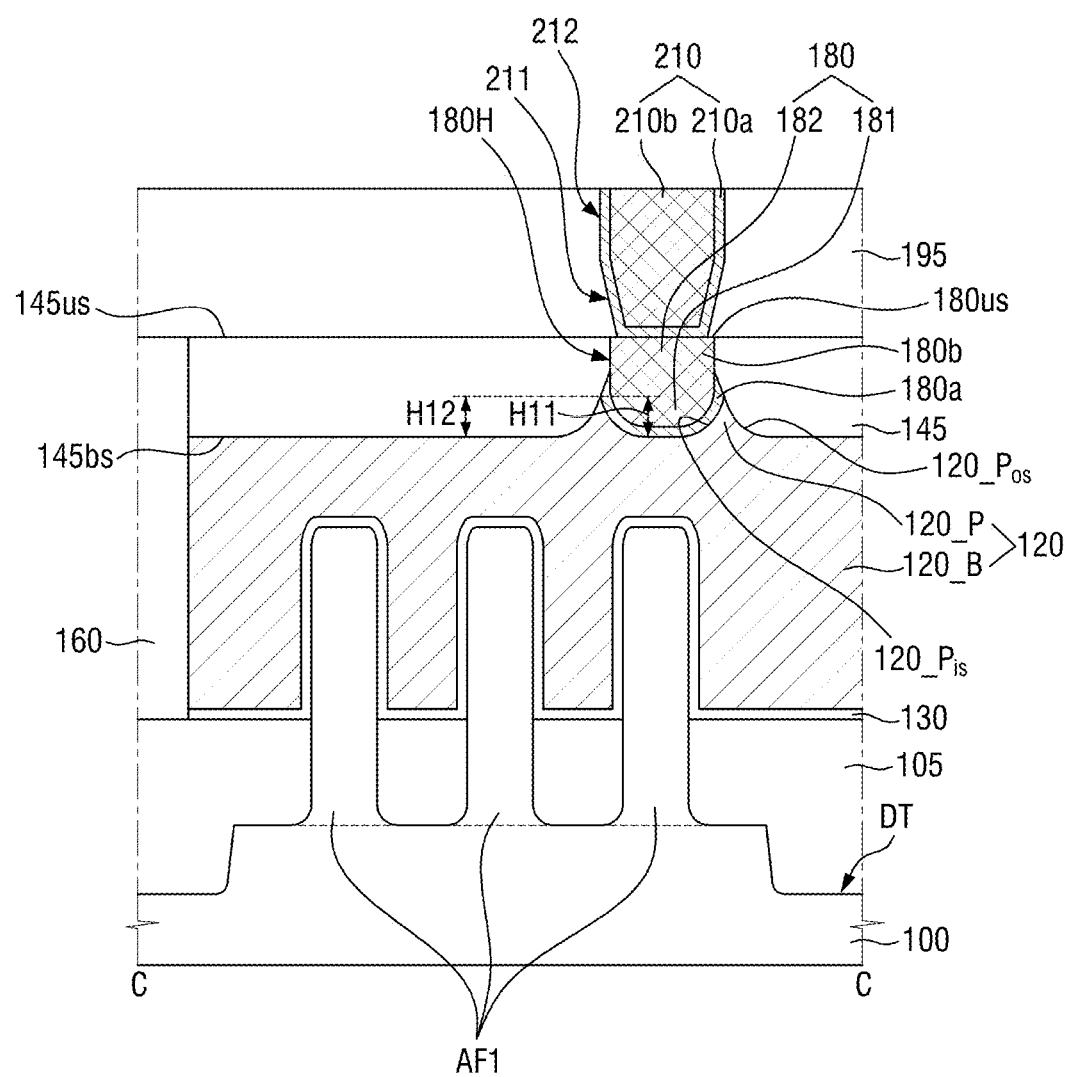
Figure 5:
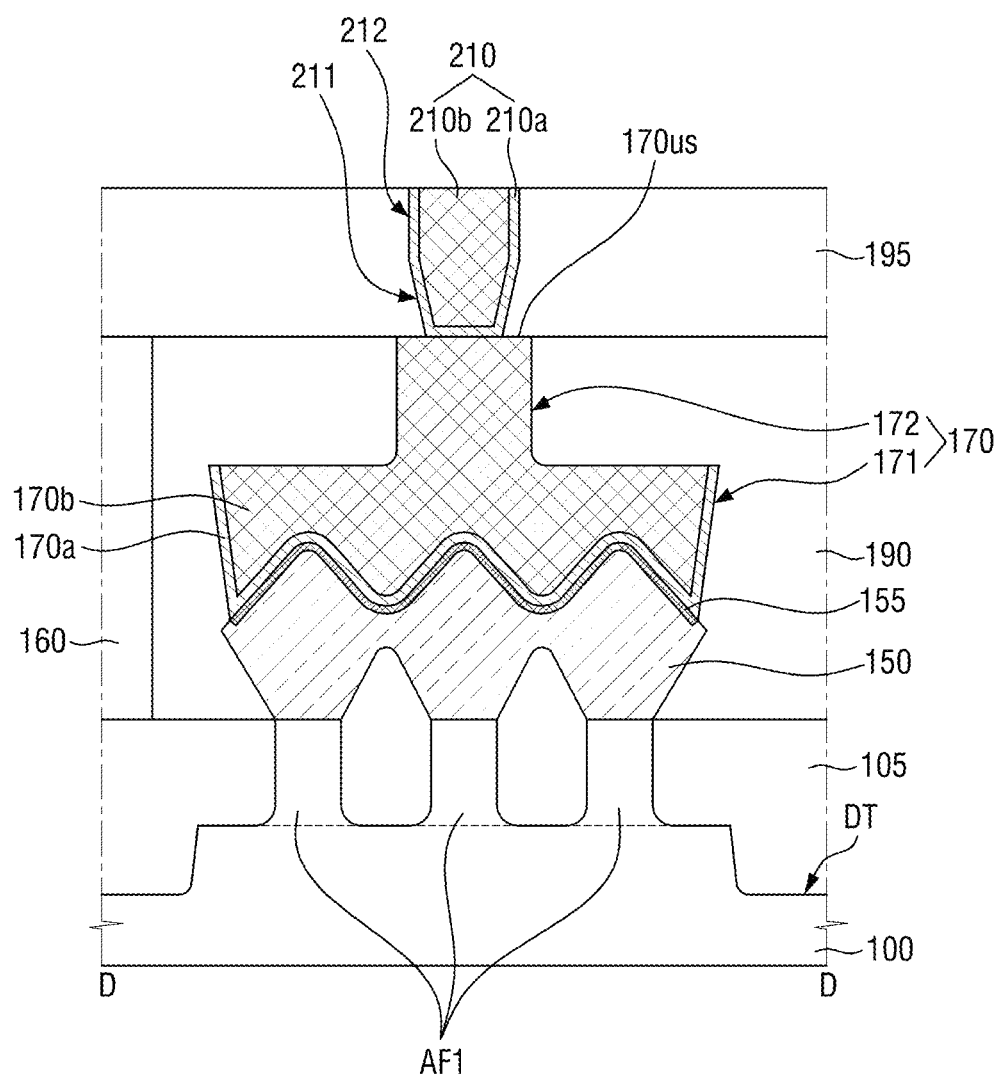

As shown in FIGS. 4a to 5, the field region FX may be defined by, but is not limited to, a deep trench DT. A person of ordinary skill in the art may distinguish between the field region and the active region.

The substrate 100 may be a silicon substrate or a silicon-on-insulator (SOI). Alternatively, the substrate 100 may include, but is not limited to, silicon germanium, silicon germanium on insulator (SGOI), indium antimonide, lead telluride, indium arsenide, indium phosphide, gallium arsenide or gallium antimonide.

A first active pattern AF1 may be formed in the first active region RX1. The first active pattern AF1 may protrude from the substrate 100 of the first active region RX1. The first active pattern AF1 may extend along a first direction X on the substrate 100. A second active pattern AF2 may be formed in the second active region RX2. The explanation of the second active pattern AF2 may be substantially the same as that of the first active pattern AF1.

For example, the first active pattern AF1 may be a multi-channel active pattern. In the semiconductor device according to some embodiments, each first active pattern AF1 may be, for example, a fin-type pattern. The first active pattern AF1 may be used as a channel pattern of a transistor. Although FIGS. 4a to 5 show an example where three first active patterns AF1 and the three second active patterns AF2 are shown, the numbers thereof are only for convenience of explanation, and are not limited thereto. The first active pattern AF1 and the second active pattern AF2 may each be one or more.

Each of the first active pattern AF1 and the second active pattern AF2 may be a part of the substrate 100, and may include an epitaxial layer grown from the substrate 100. The first active pattern AF1 and the second active pattern AF2 may include, for example, silicon or germanium, which is an elemental semiconductor material. In addition, each of the first active pattern AF1 and the second active pattern AF2 may include compound semiconductors, and may include, for example, a group IV-IV compound semiconductor or a group III-V compound semiconductor.

The group IV-IV compound semiconductor may be, for example, a binary compounds containing at least two of carbon (C), silicon (Si), germanium (Ge), and tin (Sn), a ternary compound or a compound formed by doping these elements with a group IV element.

The group III-V compound semiconductor may be, for example, one of a binary compound, a ternary compound or a quaternary compound formed by combining at least one of aluminum (Al), gallium (Ga) and indium (In) as a group III element with one of phosphorus (P), arsenic (As), and antimonium (Sb) as a group V element.

As an example, the first active pattern AF1 and the second active pattern AF2 may include the same material. As another example, the first active pattern AF1 and the second active pattern AF2 may include different materials from each other.

A field insulating film 105 may be formed on the substrate 100. The field insulating film 105 may be formed over the first active region RX1, the second active region RX2, and the field region FX. The field insulating film 105 may fill a deep trench DT.

The field insulating film 105 may be formed on a part of a side wall of the first active pattern AF1 and a part of a side wall of the second active pattern AF2. Each of the first active pattern AF1 and the second active pattern AF2 may protrude upward from an upper surface of each field insulating film 105. The field insulating film 105 may include, for example, an oxide film, a nitride film, an oxynitride film or a combination thereof.

The gate structures GS1, GS2 and GS3 may extend long in a second direction Y. The gate structures GS1, GS2 and GS3 may intersect the first active pattern AF1 and the second active pattern AF2, respectively. The gate structures GS1, GS2 and GS3 may include, for example, a gate electrode 120, a gate insulating film 130, a gate spacer 140, and a gate capping pattern 145.

Although the gate structures GS1, GS2 and GS3 are shown as being disposed over the first active region RX1 and the second active region RX2, respectively, this is only for convenience of explanation, and the embodiments are not limited thereto. In other words, at least one of the gate structures GS1, GS2 and GS3 is divided into two parts and may be disposed on the first active region RX1 and the second active region RX2.

The gate structures GS1, GS2 and GS3 may be disposed between gate cut patterns 160 extending in the first direction X. The gate structures GS1, GS2 and GS3 may be connected to the gate cut pattern 160.

The gate cut pattern 160 may include, for example, at least one of silicon nitride, silicon oxide, silicon carbide, silicon carbonitride, silicon oxycarbide, silicon oxynitride, and silicon oxycarbonitride. Although the gate cut pattern 160 is shown as a single film, it is only for convenience of explanation, and the embodiments are not limited thereto.

The gate electrode 120 may extend in the second direction Y. The gate electrode 120 may be disposed on the first active pattern AF1 and the second active pattern AF2. The gate electrode 120 may intersect the first active pattern AF1 and the second active pattern AF2.

The gate electrode 120 may include a body 120_B and a protrusion 120_P. The body 120_B of the gate electrode may extend in the second direction Y. The body 120_B of the gate electrode is disposed on the first active pattern AF1 and the second active pattern AF2, and may intersect the first active pattern AF1 and the second active pattern AF2.

The protrusion 120_P of the gate electrode may protrude in a direction different from the first direction X and the second direction Y. The protrusion 120_P of the gate electrode may protrude in a thickness direction of the substrate 100. The protrusion 120_P of the gate electrode may be defined around a gate contact 180 to be described later. The width of the protrusion 120_P of the gate electrode in the second direction Y may decrease as it goes away from the substrate 100. A relationship between the gate electrode 120 and the gate contact 180 will be described in detail below.

The gate electrode 120 may include, for example, at least one of titanium (Ti), a titanium compound, tantalum (Ta), and a tantalum compound. The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), titanium aluminum (TiAl), titanium aluminum carbonitride (TiAlC—N), titanium aluminum carbide (TiAlC), titanium carbide (TiC), tantalum carbonitride (TaCN), titanium (Ti), tantalum (Ta), and combinations thereof. The gate electrode 120 may include a conductive metal oxide, a conductive metal oxynitride, or the like, and may include a form in which the aforementioned materials are oxidized.

Although the gate electrode 120 is shown as a single film, this is only for convenience of explanation and is not limited thereto.

The gate spacer 140 may be disposed on the side wall of the gate electrode 120. The gate spacer 140 may extend in the second direction Y.

The gate spacer 140 may include, for example, at least one of silicon nitride (SiN), silicon oxynitride (SiON), silicon oxide ($SiO_2$), silicon oxycarbonitride (SiOCN), silicon boron nitride (SiBN), silicon boron oxynitride (SiOBN), silicon oxycarbide (SiOC) and combinations thereof.

The gate insulating film 130 may be formed on the first active pattern AF1, the second active pattern AF2 and the field insulating film 105. The gate insulating film 130 may be formed between the gate electrode 120 and the gate spacer 140.

The gate insulating film 130 may be formed along the profiles of the first active pattern AF1 and the second active pattern AF2 protruding upward from the field insulating film 105, and along the upper surface of the field insulating film 105. Although it is not shown, an interface film may be further formed the along the profiles of the first active pattern AF1 and the second active pattern AF2 protruding upward from the field insulating film 105. The gate insulating film 130 may be formed on the interface film.

In the semiconductor device according to some embodiments, the gate insulating film 130 may not extend along the side wall of the gate cut pattern 160. That is, the gate electrode 120 may be in contact with the gate cut pattern 160.

The gate insulating film 130 may include silicon oxide, silicon oxynitride, silicon nitride, or a high dielectric constant material having a higher dielectric constant than silicon oxide, respectively. Examples of the high dielectric constant material may include one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The gate capping pattern 145 may be disposed on the gate electrode 120 and the gate spacer 140. The gate capping pattern 145 may be disposed between the gate spacers 140.

The gate capping pattern 145 may include a lower surface 145bs and an upper surface 145us opposite to each other. The lower surface 145bs of the gate capping pattern may face the substrate 100. In the semiconductor device according to some embodiments, the upper surface 145us of the gate capping pattern may be located on the same plane as the upper surface of the gate spacer 140. Also, the upper surface 145*us* of the gate capping pattern may be located on the same plane as the upper surface of the gate cut pattern 160.

The gate capping pattern 145 may include, for example, at least one of silicon nitride (SiN), silicon oxynitride (SiON), silicon oxide (SiO$_2$), silicon carbonitride (SiCN), silicon oxycarbonitride (SiOCN), and a combination thereof.

A source/drain pattern 150 may be formed on the first active pattern AF1. The source/drain pattern 150 may be located on the substrate 100. The source/drain pattern 150 may be located on at least one side of the gate structures GS1, GS2 and GS3.

The source/drain pattern 150 may include an epitaxial pattern. The source/drain pattern 150 may be included in the source/drain of a transistor that uses the first active pattern AF1 as a channel region.

The source/drain pattern 150 may have a form extending long in the second direction Y. The source/drain pattern 150 may be connected to the first active pattern AF1. For example, the source/drain pattern 150 may be connected to a channel pattern part used as the channel of the first active pattern AF1.

Although three epitaxial patterns each formed on the first active pattern AF1 are shown to be merged in the source/drain pattern 150, this is only for convenience of explanation and is not limited thereto. That is, the epitaxial patterns formed on the respective first active patterns AF1 may be separated from each other. Or, two adjacent epitaxial films may be merged and the remaining one may be separated.

The first source/drain contact 170 may be disposed on the first active region RX1. The second source/drain contact 270 may be disposed on the second active region RX2.

The first source/drain contact 170 may be connected to the source/drain pattern 150 formed in the first active region RX1. Although it is not shown, the second source/drain contact 270 may be connected to a source/drain pattern formed in the second active region RX2.

The following explanation will be provided, using the first source/drain contact 170 and the first gate contact 180 disposed on the first active region RX1.

The first source/drain contact 170 may be connected to the source/drain pattern 150. The first source/drain contact 170 may be disposed on the source/drain pattern 150.

A silicide film 155 may be formed between the first source/drain contact 170 and the source/drain pattern 150. Although the silicide film 155 is shown to be formed along the profile of the interface between the source/drain pattern 150 and the first source/drain contact, the embodiment is not limited thereto. The silicide film 155 may include, for example, a metal silicide material.

The first source/drain contact 170 may include a first lower contact structure 171 extending in the second direction Y, and a first upper contact structure 172 on the first lower contact structure 171. The first upper contact structure 172 may protrude from the first lower contact structure 171. The first upper contact structure 172 is directly connected to the first lower contact structure 171.

In the semiconductor device according to some embodiments, the width of the first lower contact structure 171 in the second direction Y is greater than the width of the first upper contact structure 172. For example, in a cross-sectional view taken in the second direction Y, the first source/drain contact 170 may have a "T" shape rotated by 180 degrees.

However, unlike the case shown in FIG. 5, the width of the first source/drain contact 170 in the second direction Y may increase or be constant as it goes away from the substrate 100.

In the semiconductor device according to some embodiments, the upper surface 170*us* of the first source/drain contact may be located on the same plane as the upper surface 145*us* of the gate capping pattern. The upper surface of the first upper contact structure 172 may be located on the same plane as the upper surface 145*us* of the gate capping pattern.

The first source/drain contact 170 may include a first contact barrier film 170*a*, and a first contact filling film 170*b* on the first contact barrier film 170*a*. The first contact barrier film 170*a* may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Jr), rhodium (Rh), and two-dimensional (2D) material. In the semiconductor device according to some embodiments, the two-dimensional material may be a metallic material and/or a semiconductor material. The two-dimensional material (2D material) may include a two-dimensional allotrope or a two-dimensional compound, and may include, for example, but is not limited to, graphene, molybdenum disulfide (MoS$_2$), molybdenum diselenide (MoSe$_2$), tungsten diselenide (WSe$_2$), and tungsten sulfide (WS$_2$). That is, since the above-described two-dimensional materials are merely listed as examples, the two-dimensional materials that may be included in the semiconductor device of inventive concepts are not limited to the above-described materials. The first contact filling film 170*b* may include, for example, at least one of aluminum (Al), tungsten (W), cobalt (Co), ruthenium (Ru), silver (Ag), gold (Au), manganese (Mn), and molybdenum (Mo).

The gate contact 180 may be disposed on the first active region RX1 and/or the second active region RX2. The gate contact 180 may be disposed at a position that entirely overlaps the first active region RX1 and/or the second active region RX2. A part of the gate contact 180 may be disposed on the first active region RX1, and the other part of the gate contact 180 may be disposed on the second active region RX2.

The gate contact 180 may be connected to the gate structures GS1, GS2 and GS3. For example, the gate contact 180 is connected to the gate electrode 120.

The gate contact 180 may be disposed on the gate electrode 120. The gate contact 180 is in contact with the gate electrode 120.

The gate contact 180 may be disposed in the gate structures GS1, GS2 and GS3. The gate structures GS1, GS2 and GS3 may include a gate contact hole 180H. The gate contact 180 may be disposed in the gate contact hole 180H. The gate contact 180 may fill at least a part of the gate contact hole 180H.

At least a part of the gate contact hole 180H may be defined by the gate electrode 120. For example, at least a part of the gate contact hole 180H may be defined by the protrusion 120_P of the gate electrode.

The gate contact hole 180H may be defined by the protrusion 120_P of the gate electrode, the gate capping pattern 145, and the gate spacer 140. That is, a part of the gate contact hole 180H may be defined by the protrusion 120_P of the gate electrode. A remainder of the gate contact hole 180H may be defined by the gate capping pattern 145 and the gate spacer 140.

The protrusion 120_P of the gate electrode may cover at least a part of the side wall of the gate contact 180. In the semiconductor device according to some embodiments, the protrusion 120_P of the gate electrode may cover a part of the side wall of the gate contact 180. A remainder of the side wall of the gate contact 180 may be covered by the gate capping pattern 145 and the gate spacer 140.

In FIGS. 4a and 4b, in the semiconductor device according to some embodiments, a part of the gate electrode 120 may be interposed between the gate contact 180 and the gate capping pattern 145 along the thickness direction of the substrate 100. The protrusion 120_P of the gate electrode may be interposed between the gate contact 180 and the gate capping pattern 145. The protrusion 120_P of the gate electrode may extend along a boundary between the gate contact 180 and the gate capping pattern 145.

In FIGS. 4a and 4b, the side wall of the gate contact 180 may be covered by the protrusion 120_P of the gate electrode and the gate capping pattern 145. The gate contact 180 may include a lower gate contact 181 and an upper gate contact 182. The protrusion 120_P of the gate electrode may cover the side wall of the lower gate contact 181. The gate capping pattern 145 may cover the side wall of the upper gate contact 182.

The upper surface 180us of the gate contact may not protrude upward from the upper surface 145us of the gate capping pattern. In the semiconductor device according to some embodiments, the upper surface 180us of the gate contact may be located on the same plane as the upper surface 145us of the gate capping pattern.

The gate contact 180 may include a gate contact barrier film 180a, and a gate contact filling film 180b on the gate contact barrier film 180a. The gate contact barrier film 180a may extend along the profile of the gate contact hole 180H. The gate contact filling film 180b may fill the gate contact hole 180H in which the gate contact barrier film 180a is disposed.

In FIG. 4a, the gate contact barrier film 180a may extend up to the upper surface 145us of the gate capping pattern. Alternatively, the gate contact barrier film 180a may extend up to the upper surface of the gate contact filling film 180b.

In FIG. 4b, the gate contact barrier film 180a does not extend up to the upper surface 145us of the gate capping pattern. If the gate contact barrier film 180a and the gate electrode 120 include the same material, when the gate electrode 120 is formed, at least a part of the gate contact barrier film 180a may also be etched. Alternatively, if the gate contact barrier film 180a and the gate electrode 120 are etched by the same etching etchant, when the gate electrode 120 is formed, a part of the gate contact barrier film 180a may also be etched.

Figure 2:
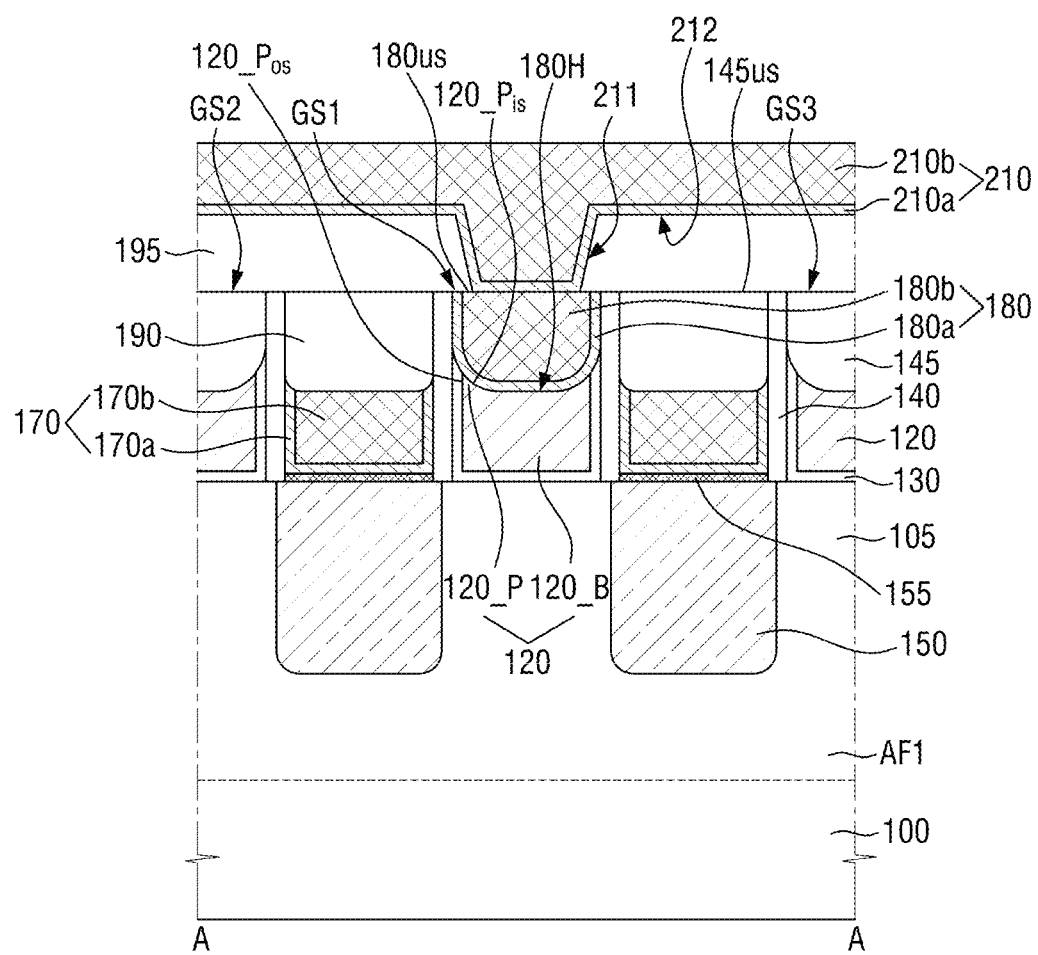
FIGS. 2 to 5 are cross-sectional views taken along lines A-A, B-B, C-C, and D-D of FIG. 1, respectively.
Figure 3:
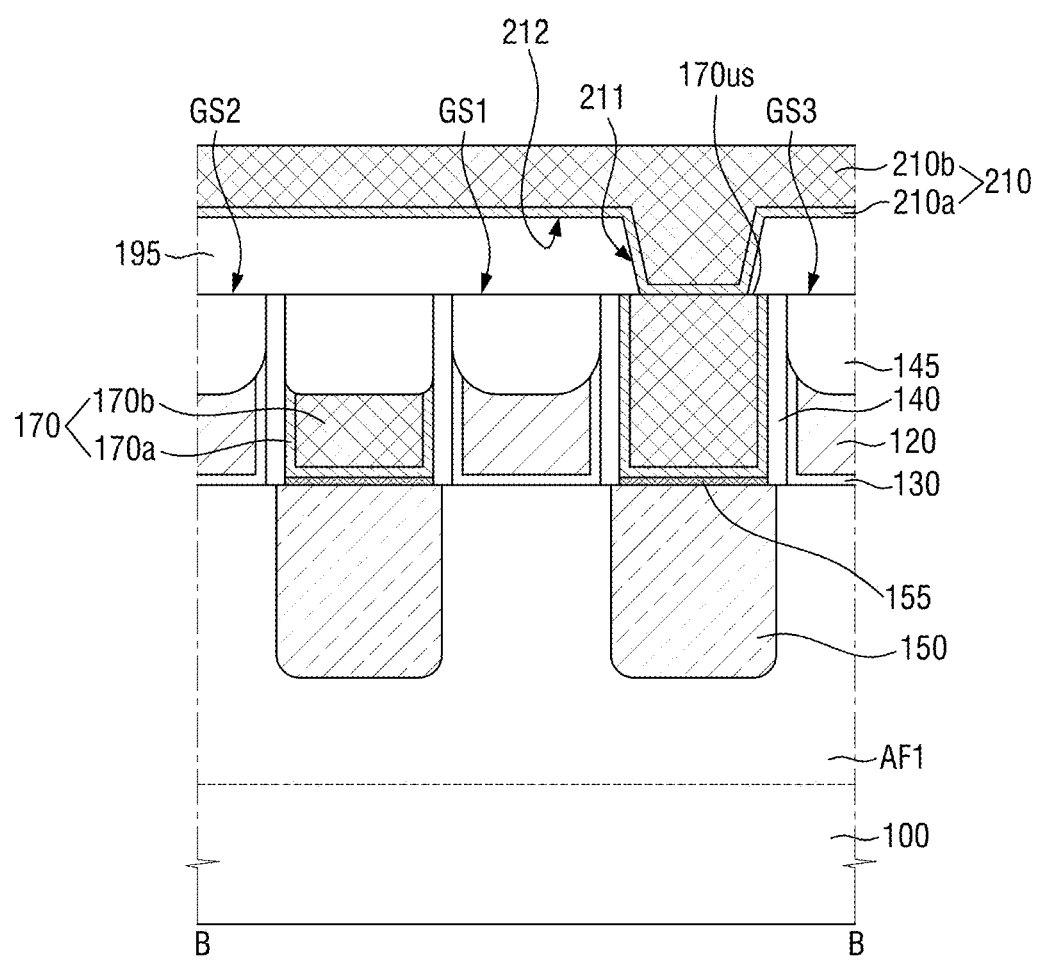

In FIG. 2, when the gate electrode 120 is formed by the etching process, the gate spacer 140 may protect the gate contact barrier film 180a from the etching process. Therefore, even in the case of FIG. 4b, the gate contact barrier film 180a may extend up to the upper surface of the gate contact filling film 180b.

The gate contact barrier film 180a may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Jr), rhodium (Rh), and two-dimensional material. The gate contact filling film 180b may include, for example, at least one of aluminum (Al), tungsten (W), cobalt (Co), ruthenium (Ru), silver (Ag), gold (Au), manganese (Mn), and molybdenum (Mo). In the semiconductor device according to some embodiments, the specific resistance of the material included in the contact filling film 180b of the gate contact 180 is smaller than the specific resistance of the material included in the gate electrode 120.

In FIGS. 2, 4a, 4b, and 6 to 7b, the protrusion 120_P of the gate electrode may include an inner wall 120_Pis and an outer wall 120_Pos opposite to each other. The outer wall 120_Pos of the protrusion 120_P of the gate electrode may be defined along the inner wall 120_Pis of the protrusion 120_P of the gate electrode.

The inner wall 120_Pis of the protrusion 120_P of the gate electrode may face the gate contact 180. The inner wall 120_Pis of the protrusion 120_P of the gate electrode may border the gate contact 180. The inner wall 120_Pis of the protrusion 120_P of the gate electrode is in contact with the gate contact 180.

The outer wall 120_Pos of the protrusion 120_P of the gate electrode may face the gate capping pattern 145 and the gate spacer 140. The outer wall 120_Pos of the protrusion 120_P of the gate electrode may border the gate capping pattern 145 and the gate spacer 140.

As it goes away from the substrate 100, a distance between the outer wall 120_Pos of the protrusion 120_P of the gate electrode and the inner wall 120_Pis of the protrusion 120_P of the gate electrode decreases. The outer wall 120_Pos of the protrusion 120_P of the gate electrode may directly join the inner wall 120_Pis of the protrusion 120_P of the gate electrode.

The inner wall 120_Pis of the protrusion 120_P of the gate electrode may include a curved surface. The outer wall 120_Pos of the protrusion 120_P of the gate electrode may also include, but is not limited to, a curved surface.

The inner wall 120_Pis of the protrusion 120_P of the gate electrode may define a gate contact pocket 120pc. The gate contact pocket 120pc may have a convex shape toward the substrate 100. Although a bottom surface of the gate contact pocket 120pc is shown to be flat, it is only for convenience of explanation, and the embodiment is not limited thereto. That is, the gate contact pocket 120pc may be defined entirely by a curved surface. The gate contact pocket 120pc may be a part of the gate contact hole 180H.

The gate contact 180 may be disposed in the gate contact pocket 120pc. A part of the gate contact 180 may be surrounded by the inner wall 120_Pis of the protrusion 120_P of the gate electrode.

In the semiconductor device according to some embodiments, a height H11 of the inner wall 120_Pis of the protrusion 120_P of the gate electrode may be the same as a height H12 of the outer wall 120_Pos of the protrusion 120_P of the gate electrode. Here, the height H11 of the inner wall 120_Pis of the protrusion 120_P of the gate electrode may be a height from the lowermost part of the gate contact hole 180H to the uppermost part of the protrusion 120_P of the gate electrode. The height H12 of the outer wall 120_Pos of the protrusion 120_P of the gate electrode may be a height from the upper surface of the body 120_B of the gate electrode to the uppermost part of the protrusion 120_P of the gate electrode.

In FIG. 7a, the height of the inner wall 120_Pis of the protrusion 120_P of the gate electrode is H11 at the protrusion 120_P of the gate electrode that borders the gate capping pattern 145. In FIG. 7b, the height of the inner wall 120_Pis of the protrusion 120_P of the gate electrode is H11E at the protrusion 120_P of the gate electrode that borders the gate spacer 140.

In FIGS. 7a and 7b, although the height H11 of the inner wall 120_Pis of the protrusion 120_P of the gate electrode that borders the gate capping pattern 145 is shown to be greater than the height H11E of the inner wall 120_Pis of the protrusion 120_P of the gate electrode that borders the gate spacer 140, the embodiment is not limited thereto.

Since the protrusion 120_P of the gate electrode covers at least a part of the side wall of the gate contact 180, the contact area between the gate electrode 120 and the gate contact 180 may increase. The contact resistance between the gate electrode 120 and the gate contact 180 in the semiconductor device according to some embodiments may be lowered than a case where the bottom surface of the gate contact is in contact with the gate electrode.

A first interlayer insulating film 190 may be formed on the field insulating film 105. The first interlayer insulating film 190 may surround the first source/drain contact 170 and the gate structures GS1, GS2 and GS3. The upper surface of the first interlayer insulating film 190 may be located on the same plane as the upper surfaces of the gate structures GS1, GS2 and GS3. The first source/drain contact 170, the second source/drain contact 270, and the gate contact 180 do not include a portion protruding upward from the upper surface of the first interlayer insulating film 190.

The first interlayer insulating film 190 may include, for example, at least one of silicon oxide, silicon nitride, silicon oxynitride, and a low dielectric constant material. The low dielectric constant material may include, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The second interlayer insulating film 195 may be disposed on the first interlayer insulating film 190. The second interlayer insulating film 195 may include, for example, at least one of silicon oxide, silicon nitride, silicon oxynitride, and a low dielectric constant material. Although it is not shown, an etching stop film may be disposed between the first interlayer insulating film 190 and the second interlayer insulating film 195.

The wiring structure 210 may be disposed in the second interlayer insulating film 195. The wiring structure 210 may be electrically connected to, for example, the first source/drain contact 170, the gate contact 180, and the second source/drain contact 270.

The wiring structure 210 may be immediately connected to the first source/drain contact 170, the first gate contact 180, and the second source/drain contact 270.

The wiring structure 210 may include a via 211 and a wiring pattern 212. The wiring structure 210 may include a wiring barrier film 210a and a wiring filling film 210b. The via 211 may be immediately connected to the first source/drain contact 170, the gate contact 180 and the second source/drain contact 270.

The via 211 and the wiring pattern 212 may include a wiring barrier film 210a and a wiring filling film 210b, respectively. The wiring barrier film 210a may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Jr), and rhodium (Rh). The wiring filling film 210b may include, for example, at least one of aluminum (Al), copper (Cu), tungsten (W), cobalt (Co), ruthenium (Ru), and molybdenum (Mo).

Although FIGS. 2 to 5 show that the wiring pattern 212 extends in the first direction X, it is only for convenience of explanation and is not limited thereto.

Figure 8:
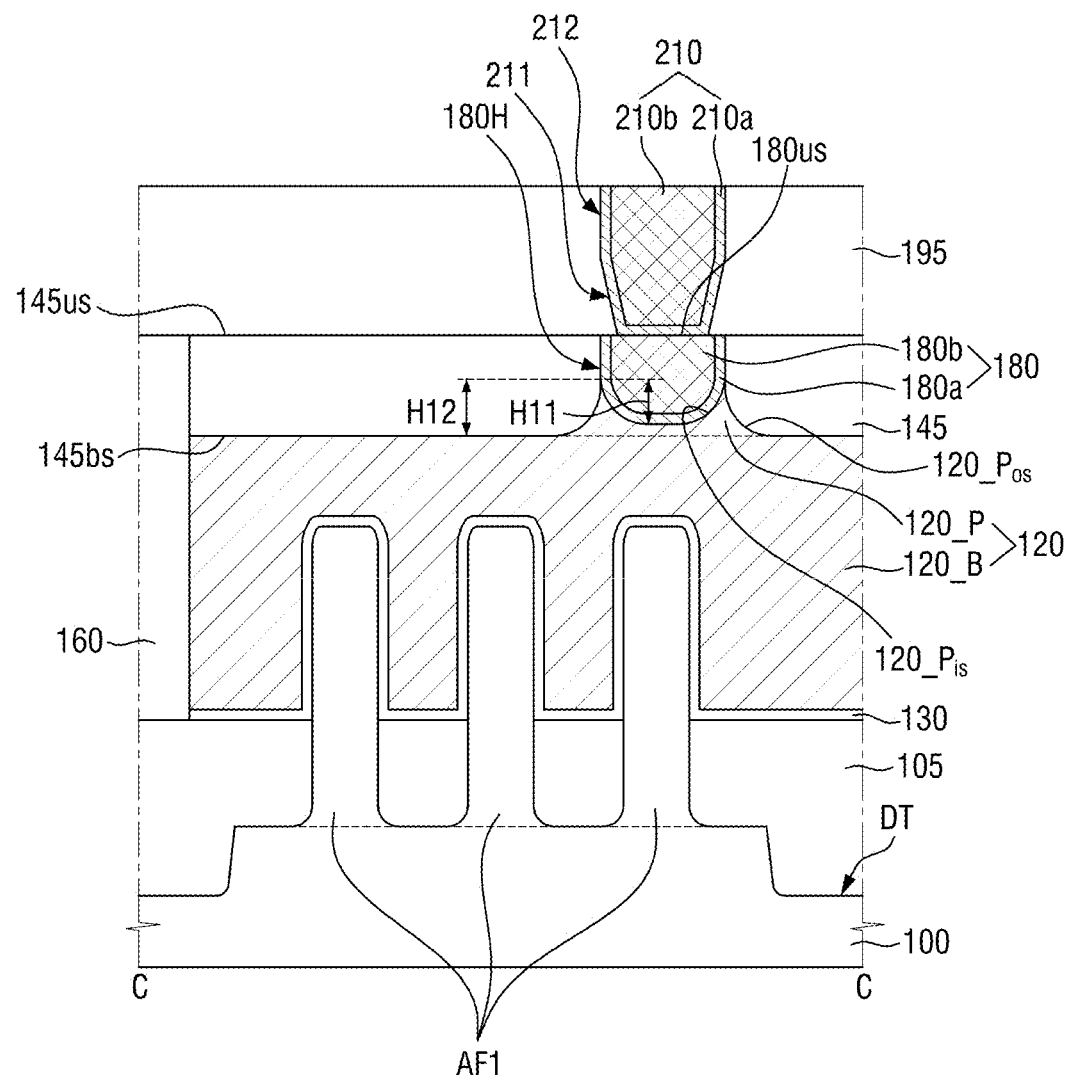
FIG. 8 is a diagram for explaining the semiconductor device according to some embodiments.
Figure 9:
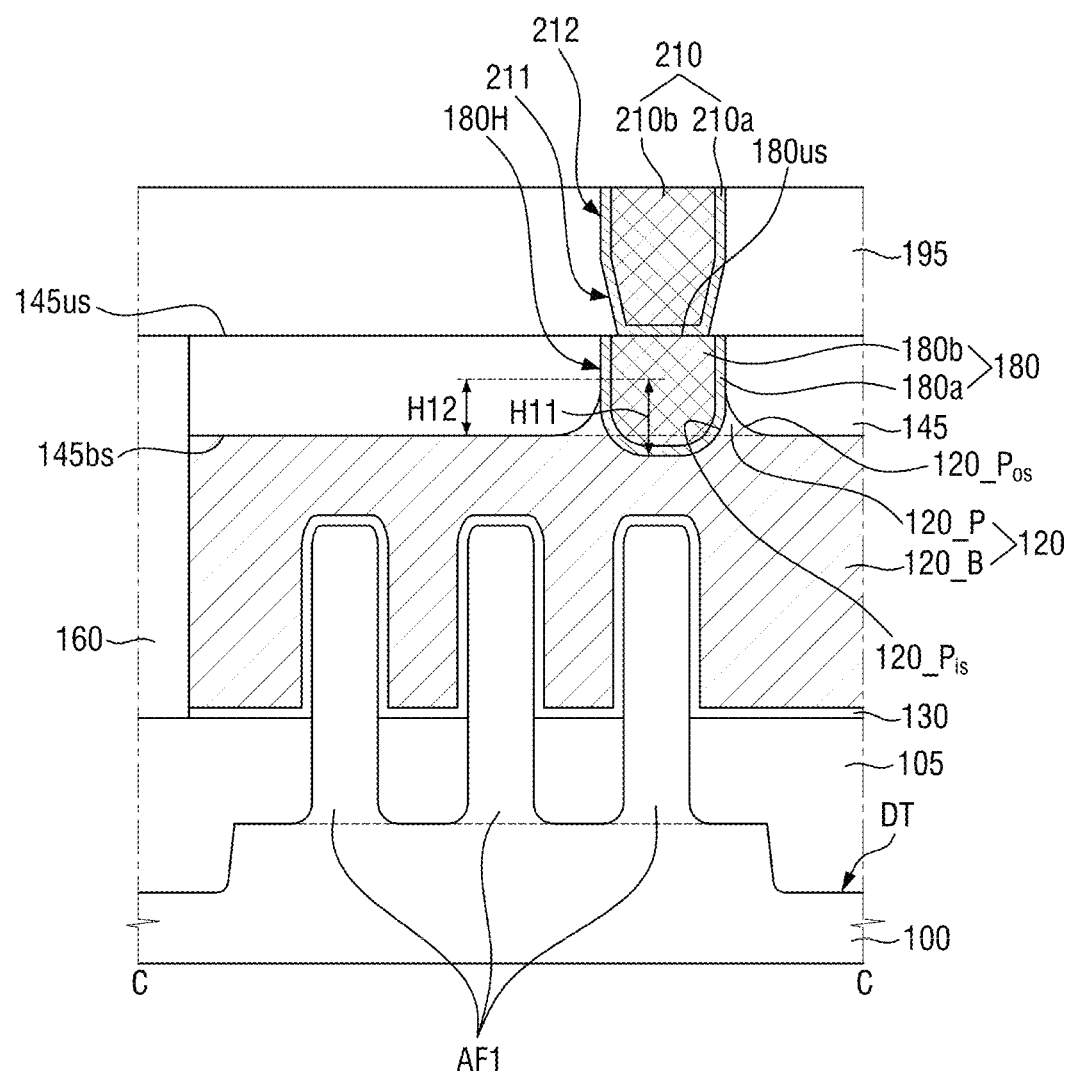
FIG. 9 is a diagram for explaining the semiconductor device according to some embodiments.
Figure 10:
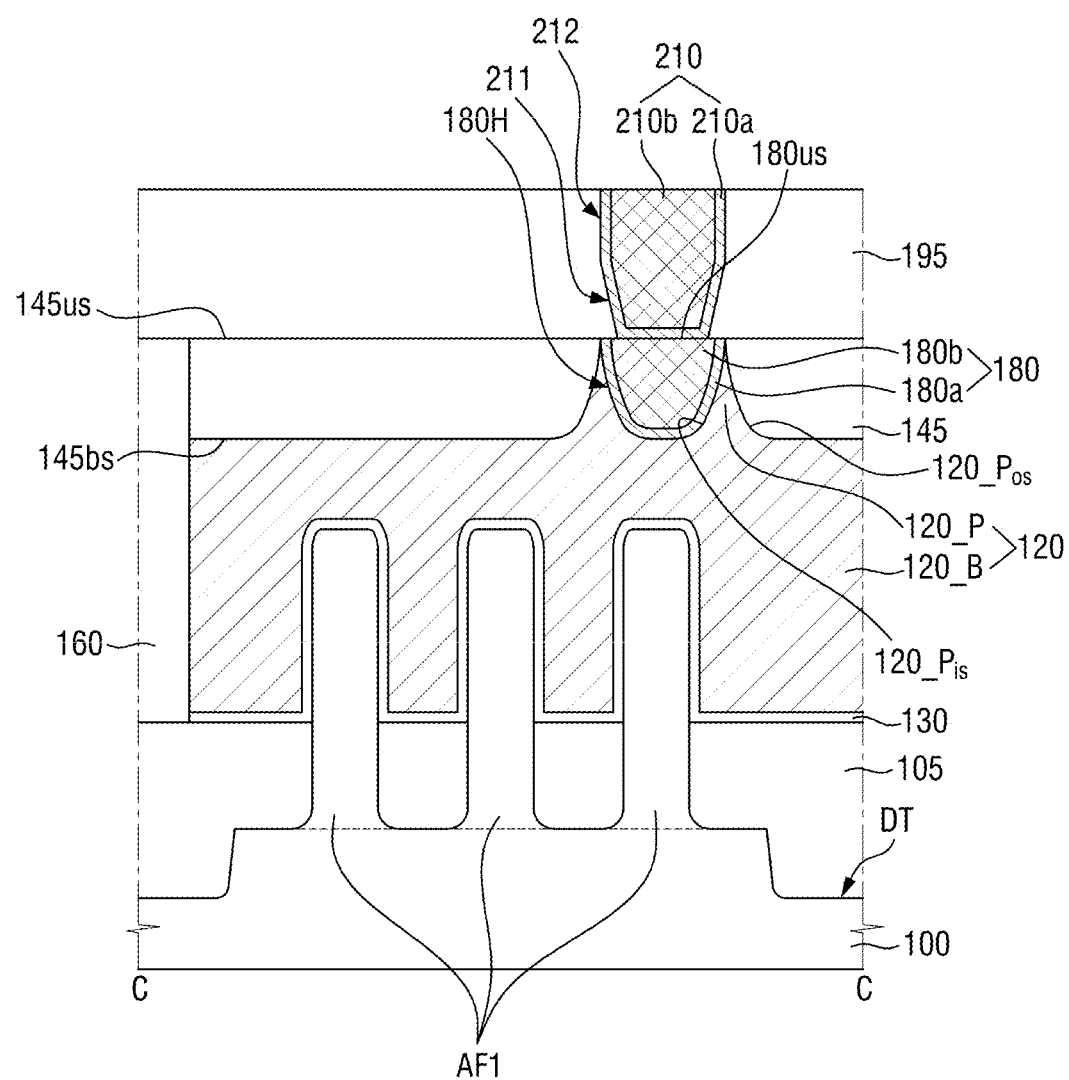
FIG. 10 is a diagram for explaining the semiconductor device according to some embodiments.

FIG. 8 is a diagram for explaining the semiconductor device according to some embodiments. FIG. 9 is a diagram for explaining the semiconductor device according to some embodiments. FIG. 10 is a diagram for explaining the semiconductor device according to some embodiments. For convenience of explanation, the explanation will focus on differences from those explained using FIGS. 1 to 7b. For reference, FIGS. 8 to 10 are cross-sectional views taken along a line C-C of FIG. 1, respectively.

Referring to FIGS. 8 and 9, in the semiconductor device according to some embodiments, the height H11 of the inner wall 120_Pis of the protrusion 120_P of the gate electrode is different from the height H12 of the outer wall 120_Pos of the protrusion 120_P of the gate electrode.

In FIG. 8, the height H11 of the inner wall 120_Pis of the protrusion 120_P of the gate electrode is smaller than the height H12 of the outer wall 120_Pos of the protrusion 120_P of the gate electrode.

In a gate electrode recess process (FIG. 30) for forming the gate capping pattern 145, when the pre-gate electrode is etched much on the basis of the bottom surface of the gate contact 180, such a shape may be fabricated.

In FIG. 9, the height H11 of the inner wall 120_Pis of the protrusion 120_P of the gate electrode is greater than the height H12 of outer wall 120_Pos of the protrusion 120_P of the gate electrode.

In the gate electrode recess process (FIG. 30) for forming the gate capping pattern 145, when the pre-gate electrode is etched less on the basis of the bottom surface of the gate contact 180, such a shape may be fabricated.

Referring to FIG. 10, in the semiconductor device according to some embodiments, the protrusion 120_P of the gate electrode may extend up to the upper surface 180us of the gate contact.

In the cross-sectional view taken in the second direction Y, the gate contact hole 180H may be defined by the protrusion 120_P of the gate electrode. The gate contact hole 180H is not defined by the gate capping pattern 145. Since the protrusion 120_P of the gate electrode is entirely interposed between the boundaries between the gate contact 180 and the gate capping pattern 145, the gate capping pattern 145 may not be in contact with the side wall of the gate contact 180.

Figure 11:
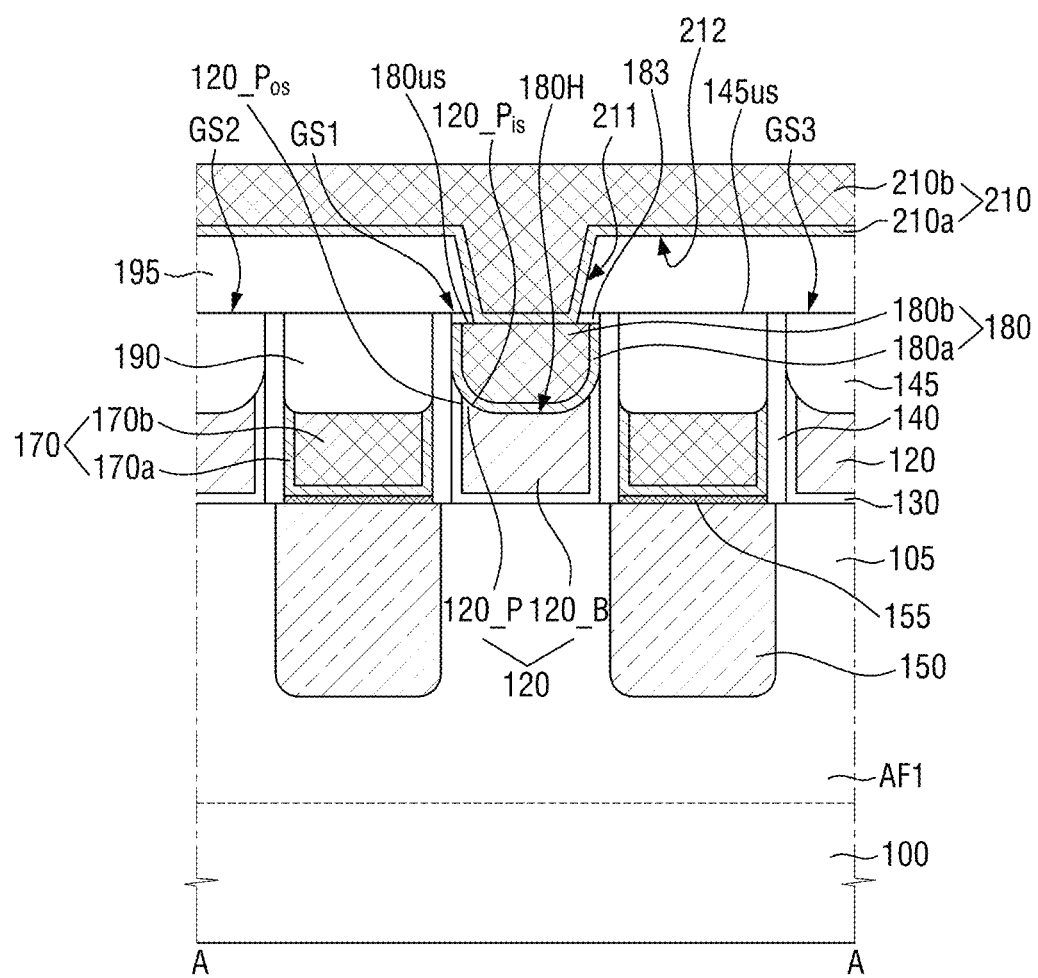
FIGS. 11 and 12 are diagrams for explaining the semiconductor device according to some embodiments.
Figure 12:
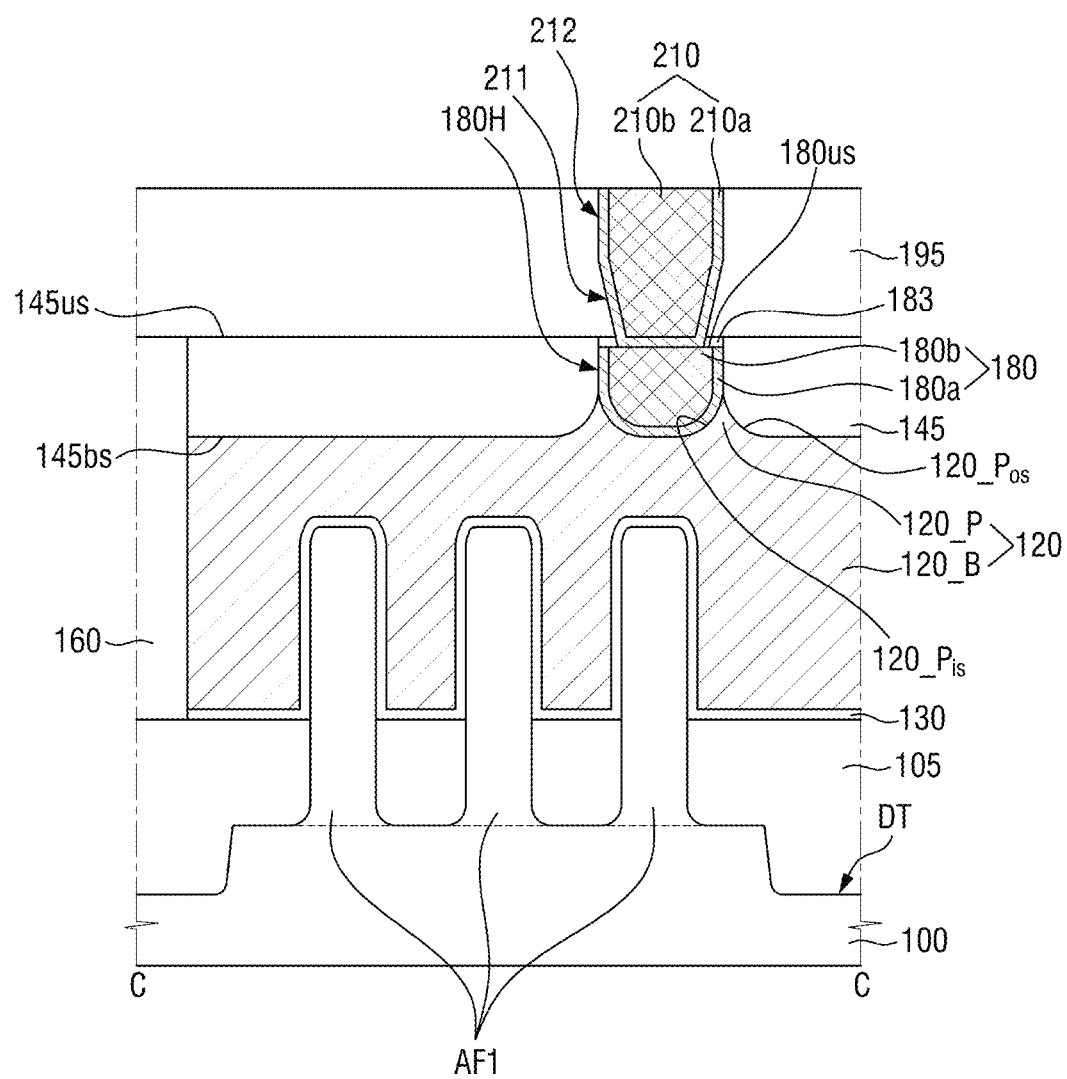

FIGS. 11 and 12 are diagrams for explaining the semiconductor device according to some embodiments. For convenience of explanation, the explanation will focus on differences from those explained using FIGS. 1 to 7b. For reference, FIG. 11 is a cross-sectional view taken along the line A-A of FIG. 1, and FIG. 12 is a cross-sectional view taken along the line C-C of FIG. 1.

Referring to FIGS. 11 and 12, the semiconductor device according to some embodiments may further include a gate contact capping film 183 disposed on the gate contact 180.

The via 211 of the wiring structure 210 may penetrate the gate contact capping film 183.

The gate contact capping film 183 may be disposed in the gate contact hole 180H. The upper surface of the gate contact capping film 183 may be located on the same plane as the upper surface of the first interlayer insulating film 190. The upper surface of the gate contact capping film 183 may be located on the same plane as the upper surface 145us of the gate capping pattern.

The upper surface 180us of the gate contact may be closer to the substrate 100 than the upper surface 145us of the gate capping pattern. On the basis of the upper surface of the first active pattern AF1, the upper surface 180us of the gate contact may be lower than the upper surface 145us of the gate capping pattern. The upper surface 180us of the gate contact is not placed on the same plane as the upper surface 145us of the gate capping pattern.

The gate contact capping film 183 may include, for example, at least one of silicon nitride (SiN), silicon oxynitride (SiON), silicon oxide (SiO$_2$), silicon carbonitride (SiCN), silicon oxycarbonitride (SiOCN) and combinations thereof.

If the gate contact capping film 183 is not removed before forming the wiring structure 210, the gate contact capping film 183 may remain on the gate contact 180.

In such a case, the upper surface 180us of the gate contact may be lower than the upper surface (170us of FIG. 3) of the first source/drain contact, on the basis of the upper surface of the first active pattern AF1.

Figure 13:
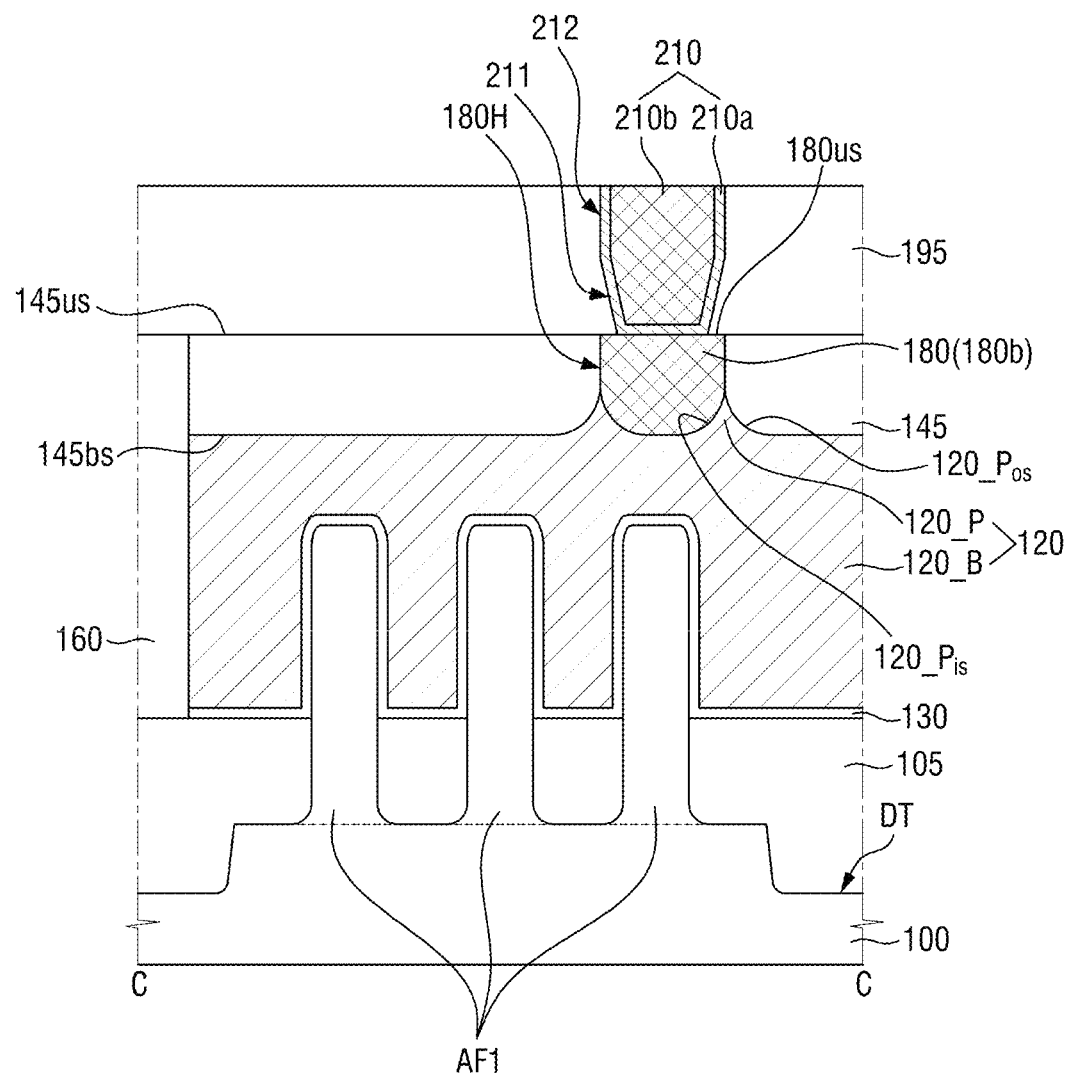
FIG. 13 is a diagram for explaining the semiconductor device according to some embodiments.
Figure 14A:
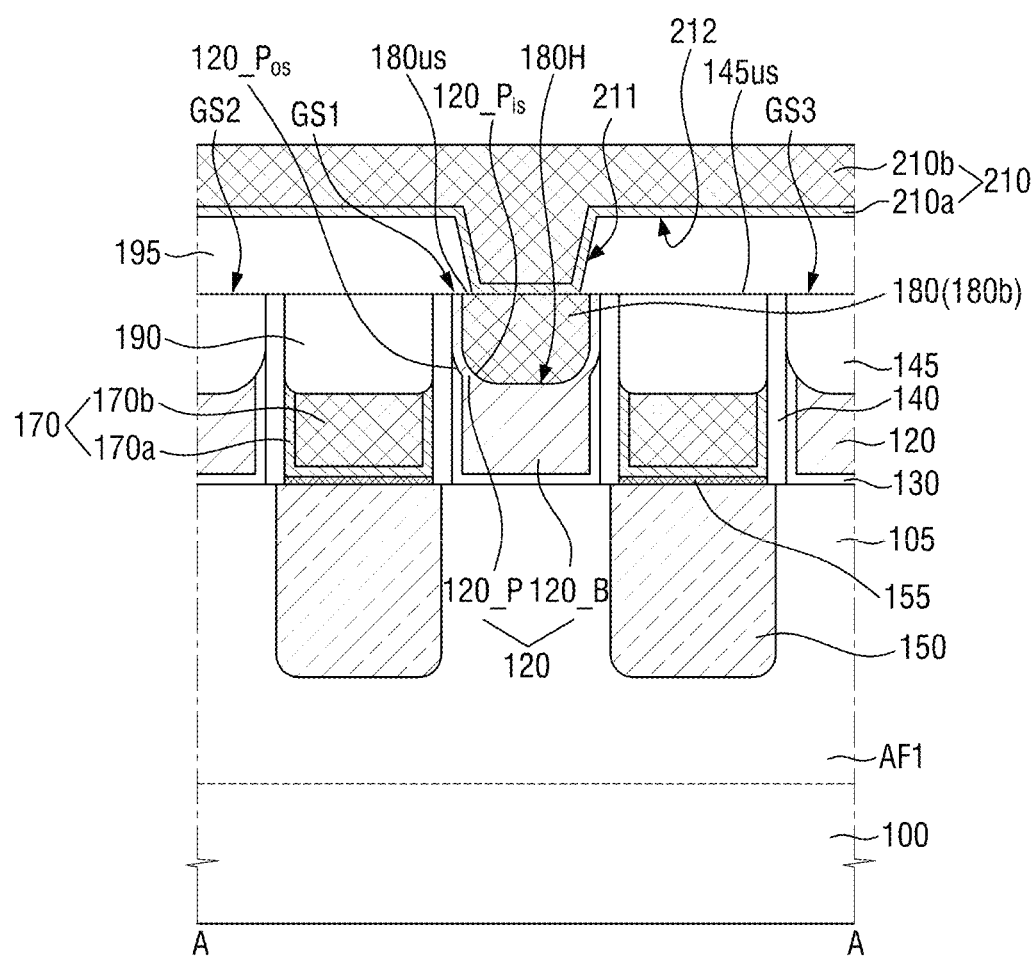
FIGS. 14a and 14b are diagrams for explaining the semiconductor device according to some embodiments.
Figure 14B:
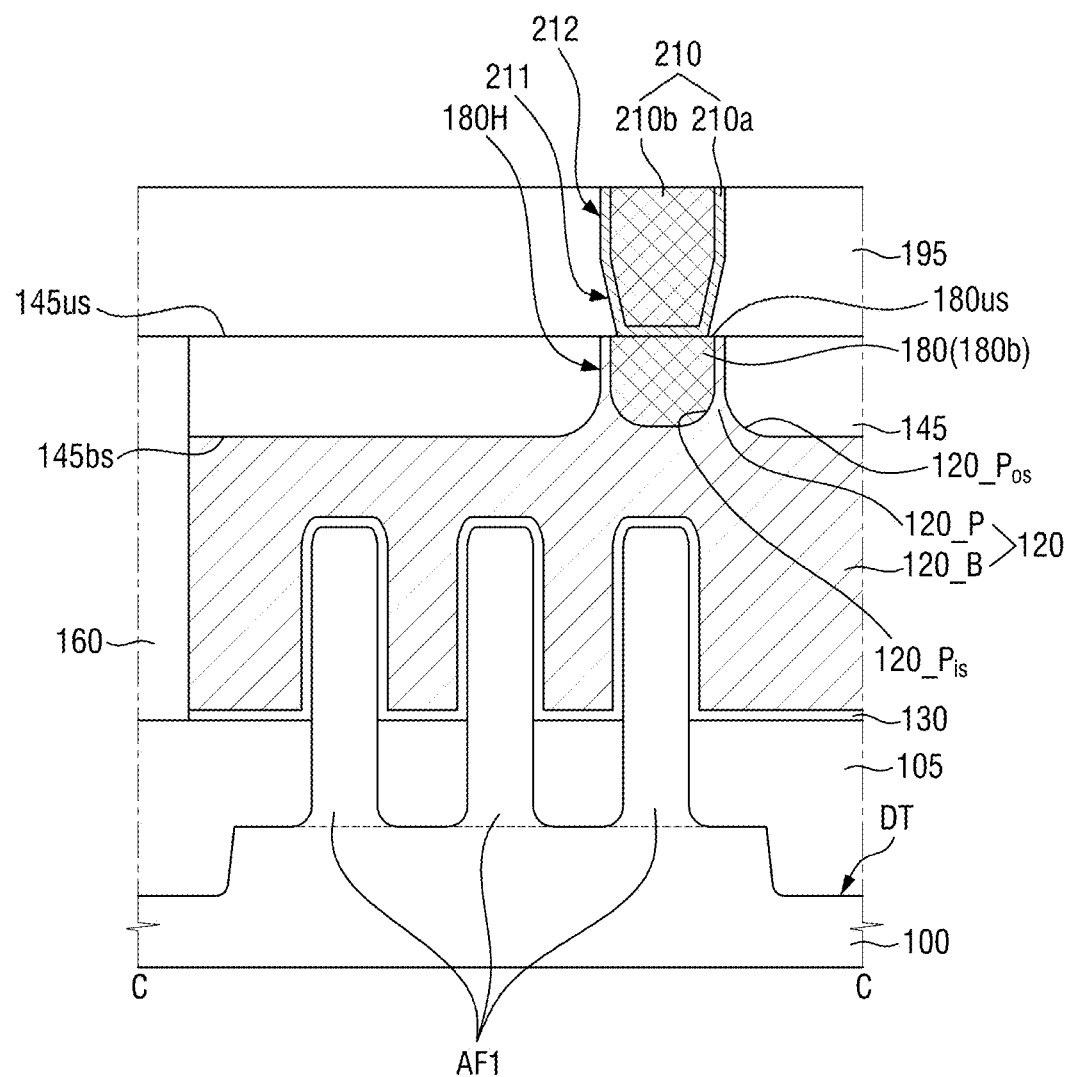
Figure 15:
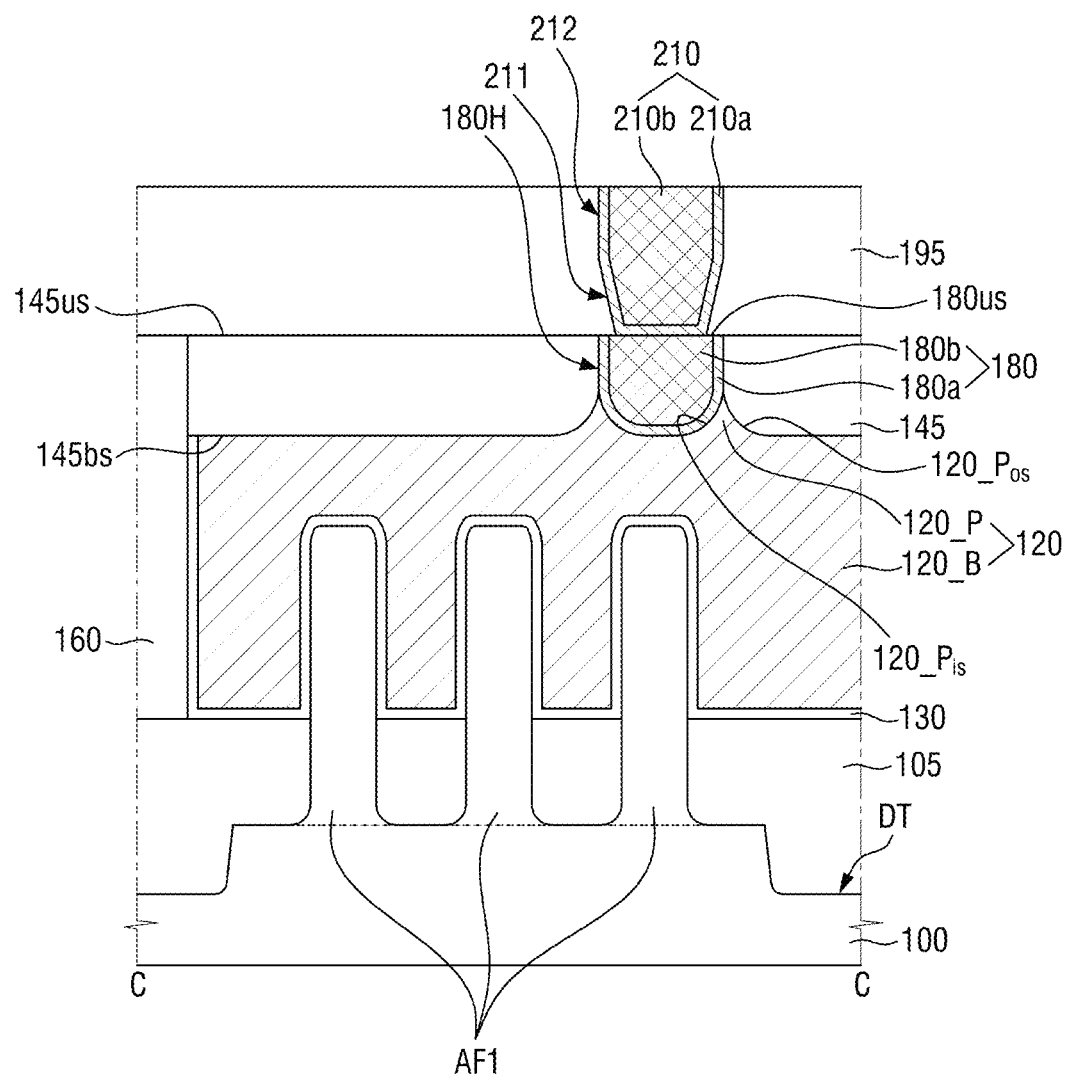
FIG. 15 is a diagram for explaining the semiconductor device according to some embodiments.

FIG. 13 is a diagram for explaining a semiconductor device according to some embodiments. FIGS. 14a and 14b are diagrams for explaining the semiconductor device according to some embodiments. FIG. 15 is a diagram for explaining the semiconductor device according to some embodiments. For convenience of explanation, the explanation will focus on differences from those explained using FIGS. 1 to 7b. For reference, FIG. 14a is a cross-sectional view taken along the line A-A of FIG. 1, and FIGS. 13, 14b and 15 are cross-sectional views taken along the line C-C of FIG. 1, respectively.

Referring to FIGS. 13 to 14b, in the semiconductor device according to some embodiments, the gate contact 180 may include a gate contact filling film 180b without a gate contact barrier film (180a of FIG. 4a).

The gate contact filling film 180b may be in contact with the protrusion 120_P of the gate electrode.

In FIG. 13, the gate contact filling film 180b may be in contact with the gate capping pattern 145 and the gate spacer (140 of FIG. 2). The outer wall 120_Pos of the protrusion 120_P of the gate electrode may directly join the inner wall 120_Pis of the protrusion 120_P of the gate electrode.

Unlike the case shown in FIG. 13, the protrusion 120_P of the gate electrode may extend up to the upper surface 145us of the gate capping pattern and the upper surface 180us of the gate contact.

In FIGS. 14a and 14b, the outer wall 120_Pos of the protrusion 120_P of the gate electrode may not directly join the inner wall 120_Pis of the protrusion 120_P of the gate electrode. The protrusion 120_P of the gate electrode may include an upper surface placed on the same plane as the upper surface 145us of the gate capping pattern.

The gate contact 180 may not be in contact with the gate capping pattern 145 and the gate spacer 140. In FIG. 14a, the protrusion 120_P of the gate electrode may cover the upper surface of the gate insulating film 130.

Referring to FIG. 15, in the semiconductor device according to some embodiments, the gate insulating film 130 may extend along the side wall of the gate cut pattern 160.

The gate insulating film 130 may be interposed between the gate electrode 120 and the gate cut pattern 160.

Figure 16:
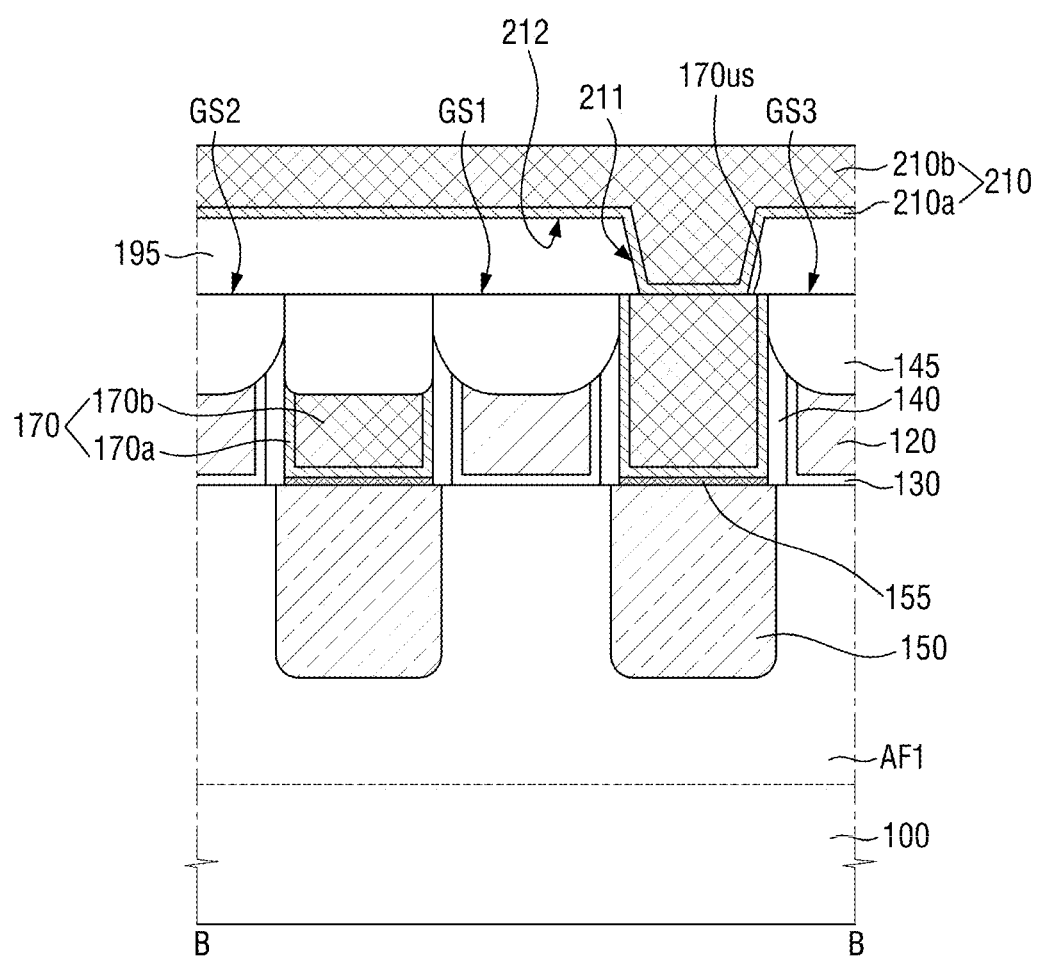
FIGS. 16 and 17 are diagrams for explaining the semiconductor device according to some embodiments.
Figure 17:
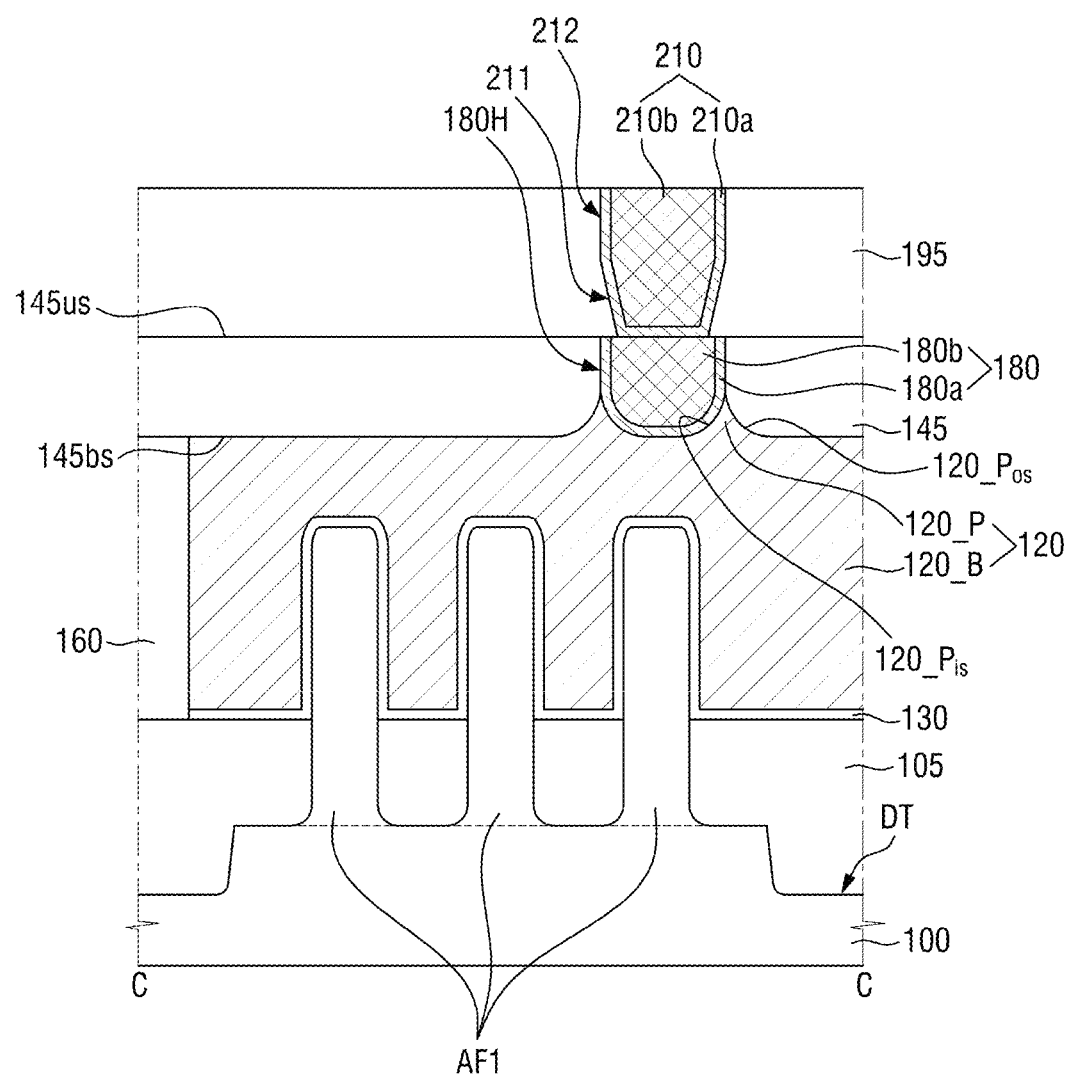

FIGS. 16 and 17 are diagrams for explaining the semiconductor device according to some embodiments. For convenience of explanation, the explanation will focus on differences from those explained using FIGS. 1 to 7b. For reference, FIG. 16 is a cross-sectional view taken along the line B-B of FIG. 1, and FIG. 17 is a cross-sectional view taken along the line C-C of FIG. 1.

Referring to FIGS. 16 and 17, in the semiconductor device according to some embodiments, a gate capping pattern 145 may be disposed on the gate electrode 120 and the gate spacer 140.

The upper surface of the gate spacer 140 may be recessed toward the upper surface of the first active pattern AF1, like the upper surface of the gate electrode 120.

The gate capping pattern 145 may be disposed on the gate cut pattern 160. The gate capping pattern 145 may cover the upper surface of the gate cut pattern 160.

Although it is not shown, in FIG. 2 which is a cross-sectional view taken in the first direction X, the gate capping pattern 145 may be interposed between the gate contact 180 and the first interlayer insulating film 190.

Figure 18:
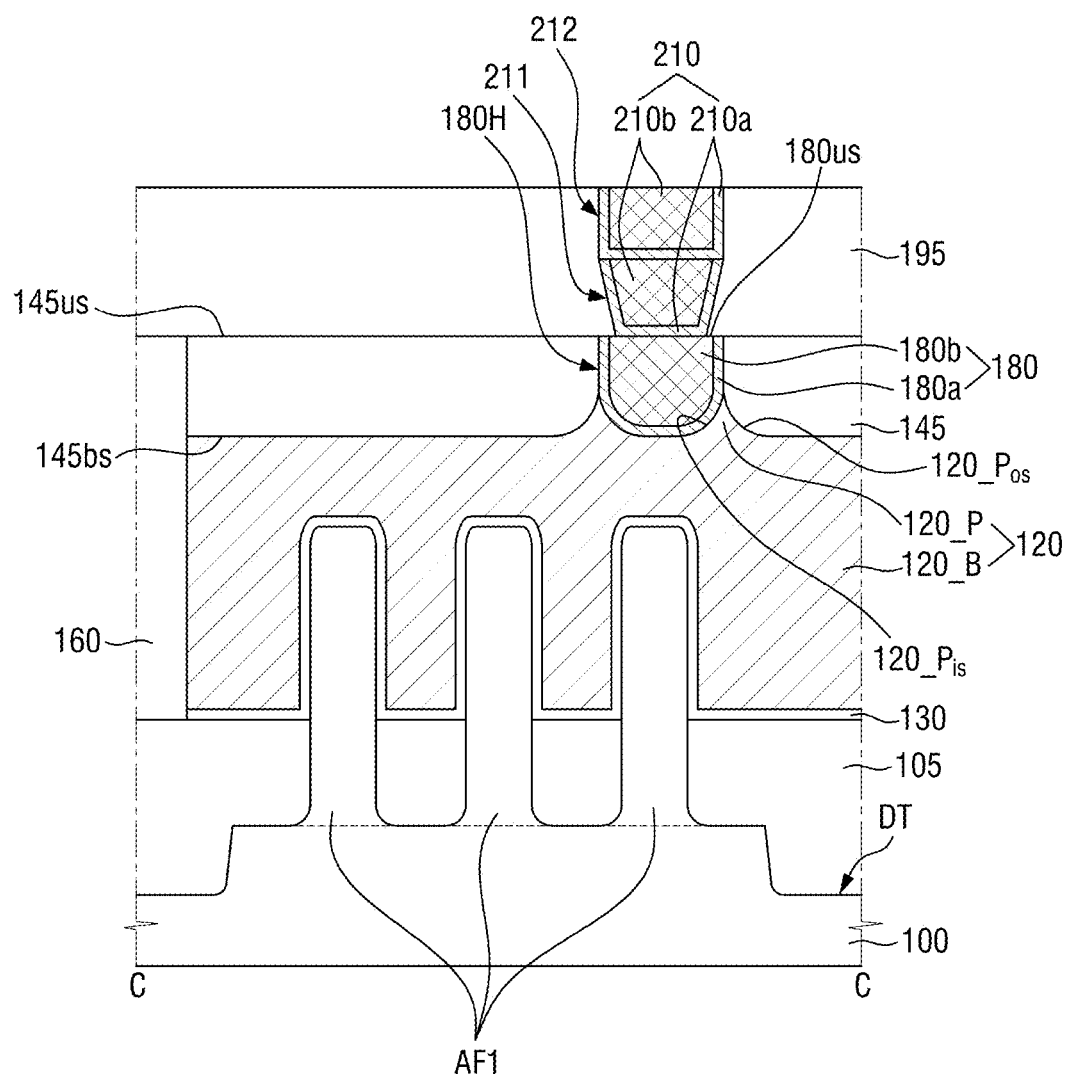
FIG. 18 is a diagram for explaining the semiconductor device according to some embodiments.
Figure 19:
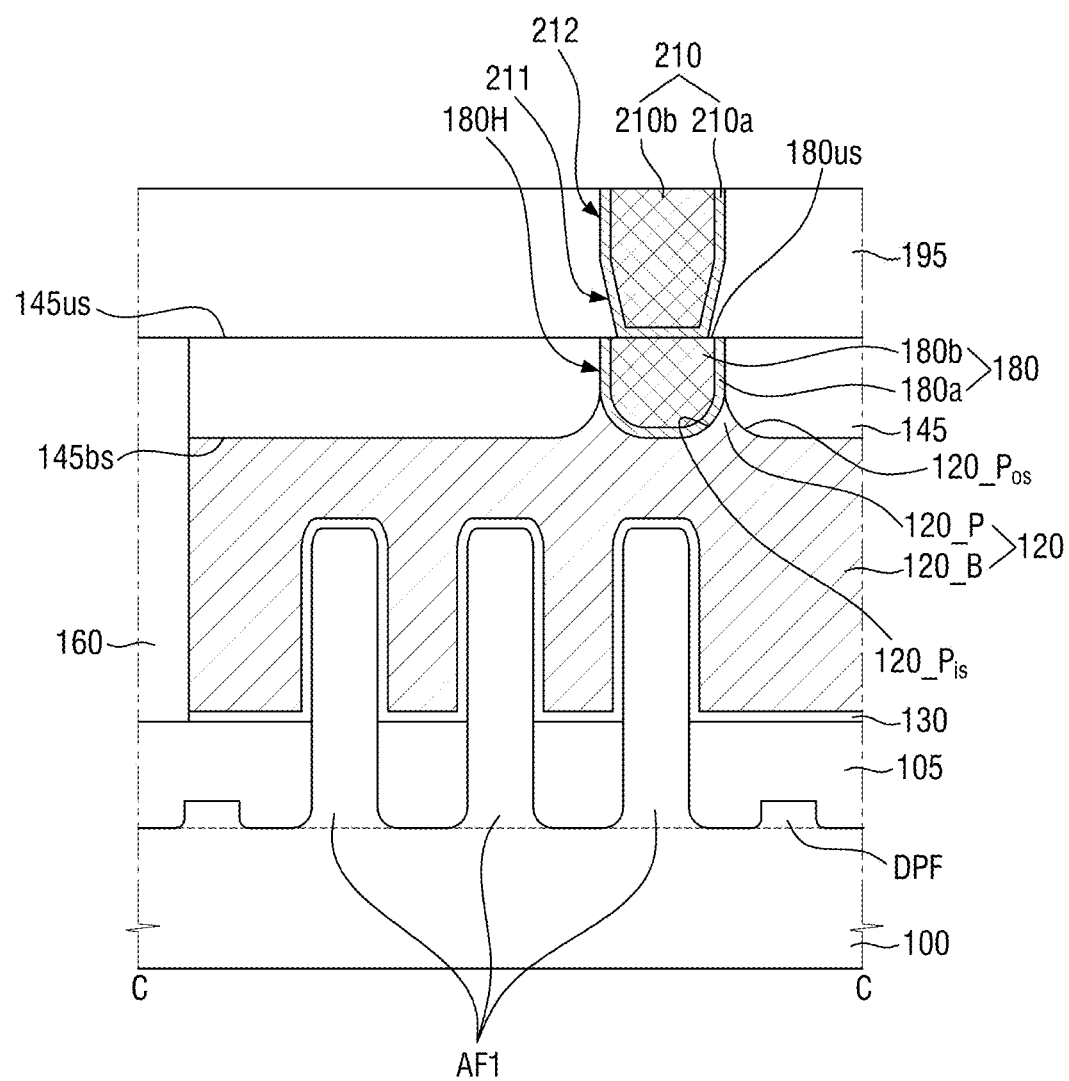
FIG. 19 is a diagram for explaining the semiconductor device according to some embodiments.
Figure 20:
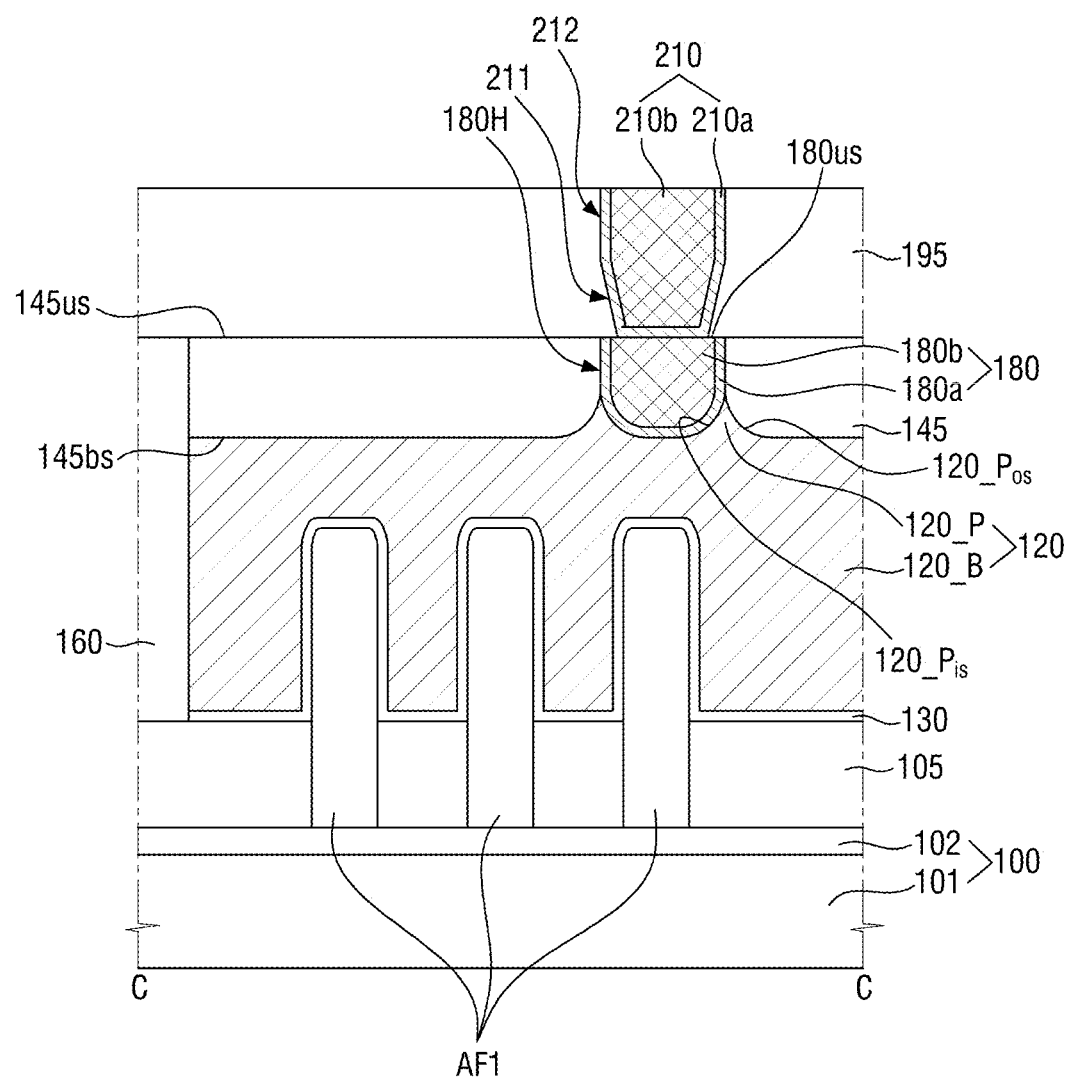
FIG. 20 is a diagram for explaining the semiconductor device according to some embodiments.

FIG. 18 is a diagram for explaining a semiconductor device according to some embodiments. FIG. 19 is a diagram for explaining the semiconductor device according to some embodiments. FIG. 20 is a diagram for explaining the semiconductor device according to some embodiments. For convenience of explanation, the explanation will focus on differences from those explained using FIGS. 1 to 7b. For reference, FIGS. 18 to 20 are cross-sectional views taken along the line C-C of FIG. 1, respectively.

Referring to FIG. 18, in the semiconductor device according to some embodiments, a wiring barrier film 210a may be disposed between a wiring filling film 210b included in the via 211 and a wiring filling film 210b included in a wiring pattern 212.

The via 211 may be formed through a fabricating process different from that of the wiring pattern 212.

Referring to FIG. 19, the semiconductor device according to some embodiments may include a dummy protrusion pattern DPF formed in a field region FX. No deep trench (DT of FIG. 2) is formed in the field region FX.

An upper surface of the dummy protrusion pattern DPF is covered with the field insulating film 105.

Referring to FIG. 20, in the semiconductor device according to some embodiments, a substrate 100 may include a base substrate 101, and a buried insulating film 102 on the base substrate 101.

The base substrate 101 may include, but is not limited to, a semiconductor material. The buried insulating film 102 may be formed entirely along the upper surface of the base substrate 101. The buried insulating film 102 may include an insulating material.

Figure 21A:
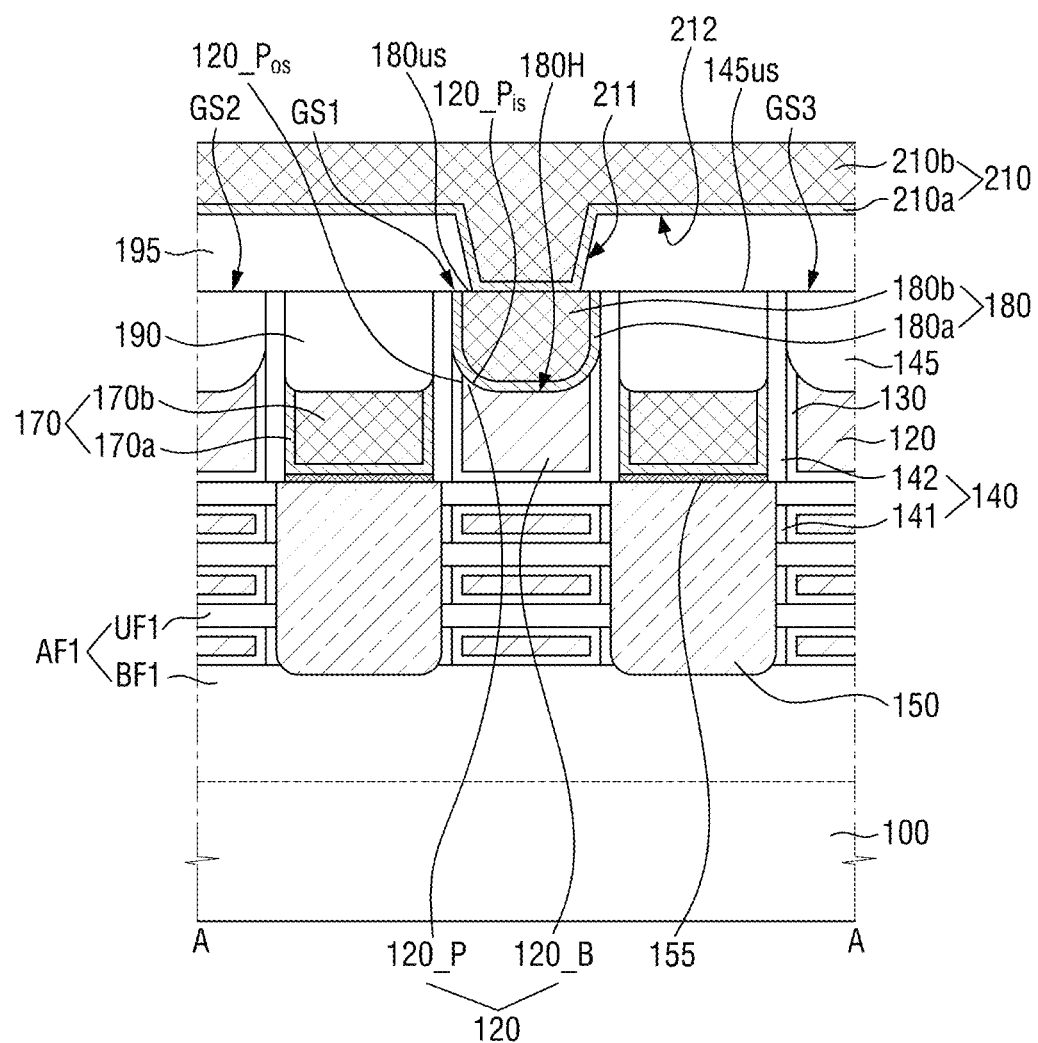
FIGS. 21a to 22 are diagrams for explaining the semiconductor device according to some embodiments.
Figure 21B:
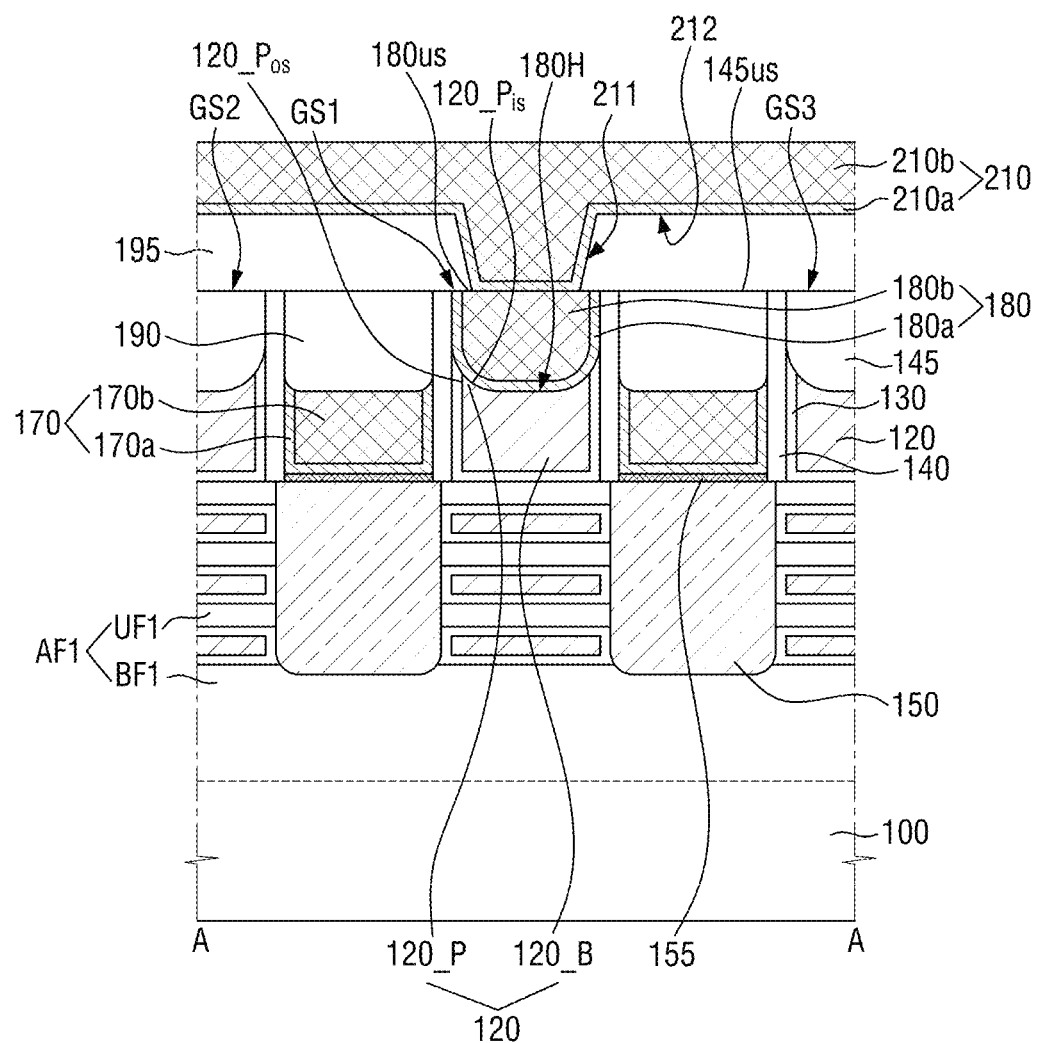
Figure 22:
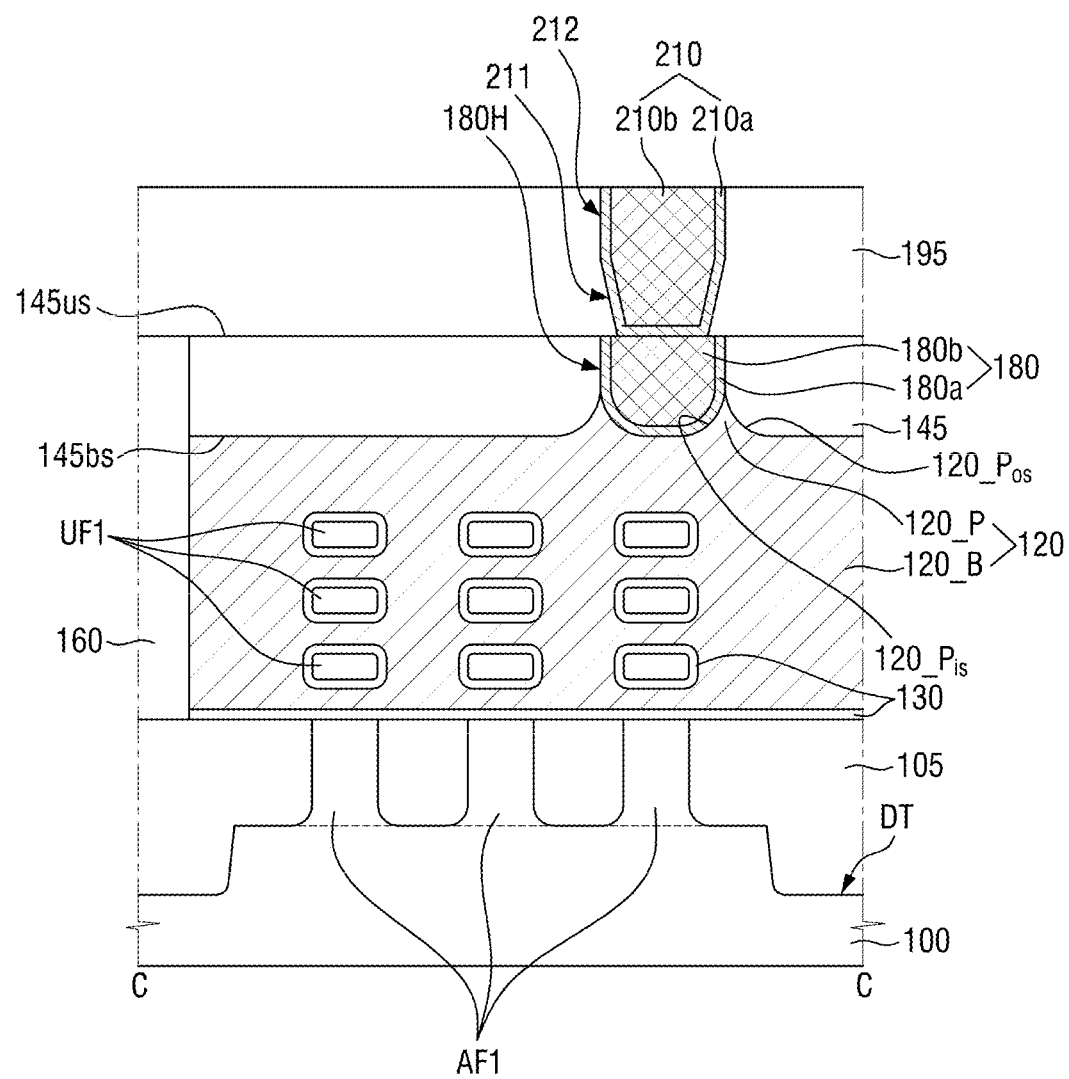

FIGS. 21a to 22 are diagrams for explaining the semiconductor device according to some embodiments. For convenience of explanation, the explanation will focus on differences from those explained using FIGS. 1 to 7b.

Referring to FIGS. 1 and 21a to 22, in the semiconductor device according to some embodiments, a first active pattern AF1 may include a lower pattern BF1 and an upper pattern UF1.

The lower pattern BF1 may extend in the first direction X. The lower pattern BF1 may have a fin-like shape. The plurality of upper patterns UF1 may be disposed on the lower pattern BF1 to be spaced apart from the lower pattern BF1. The upper patterns UF1 may be disposed to be spaced apart from each other in the first direction X. Although the three upper patterns UF1 are shown, the number thereof is only for convenience of explanation and is not limited thereto.

The upper patterns UF1 may be connected to the source/drain pattern 150. The upper patterns UF1 may be channel patterns used as channel regions of the transistor. For example, the upper pattern UF may be a nanosheet or nanowire.

The gate electrode 120 may wrap each upper pattern UF1. The gate electrode 120 may be disposed between the upper patterns UF1 spaced apart from each other in the thickness direction of the substrate 100. The gate insulating film 130 may wrap each upper pattern UF1.

In FIG. 21a, the gate spacer 140 may include an inner spacer 141 and an outer spacer 142. The inner spacer 141 may include a material different from that of the outer spacer 142 or may include the same material as that of the outer spacer 142.

In FIG. 21b, unlike FIG. 21a, the gate spacer 140 does not include the inner spacer.

Figure 23:
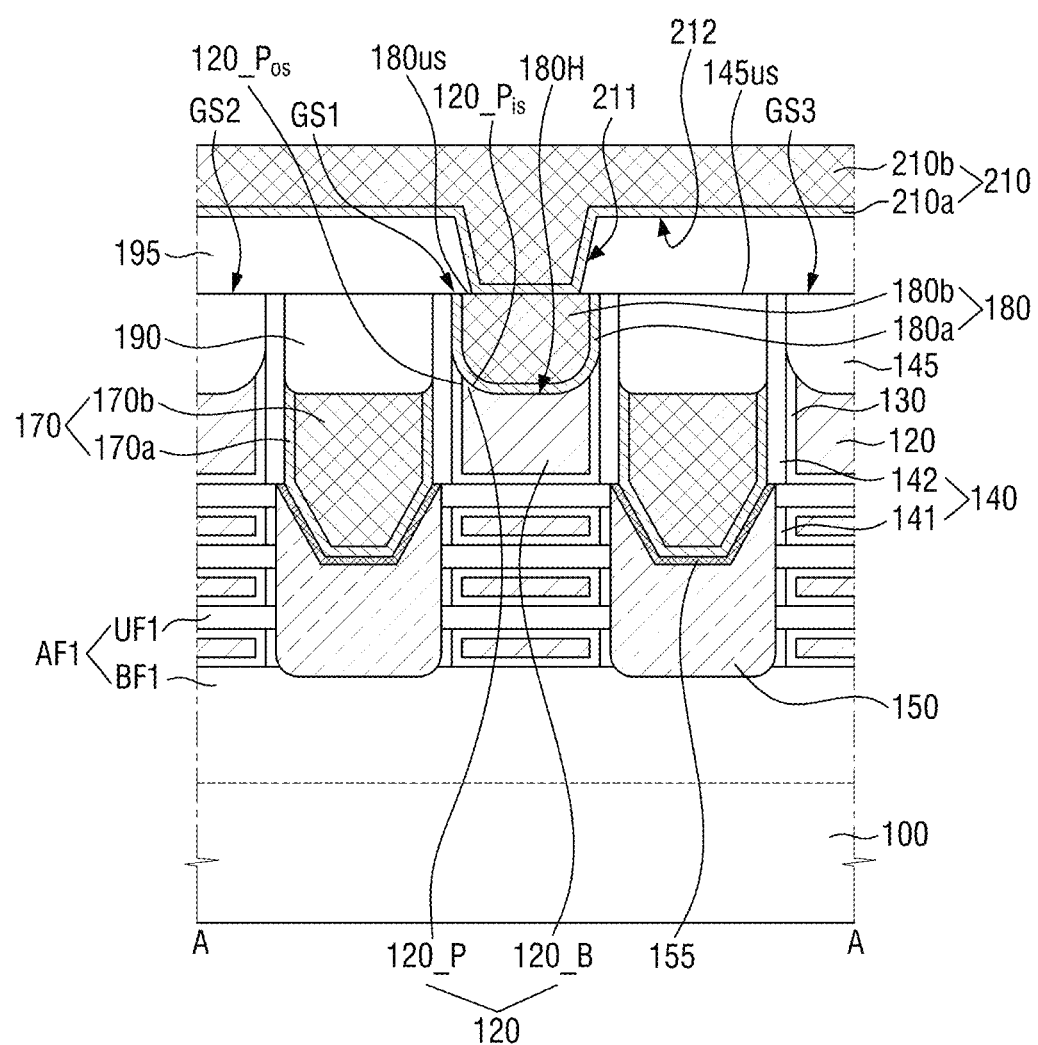
FIG. 23 is a diagram for explaining the semiconductor device according to some embodiments.

FIG. 23 is a diagram for explaining a semiconductor device according to some embodiments. For the sake of convenience, the explanation will focus on differences from those explained using FIGS. 21a and 22.

Referring to FIG. 23, a part of the first source/drain contact 170 may be inserted into the source/drain pattern 150.

A silicide film 155 may be formed between the source/drain pattern 150 and the first source/drain contact 170 inserted into the source/drain pattern 150. A bottom surface of the first source/drain contact 170 may be located between the upper surface of the upper pattern disposed at the lowermost part of the plurality of upper patterns UF1 and the lower surface of the upper pattern disposed at the uppermost part.

Figure 24:
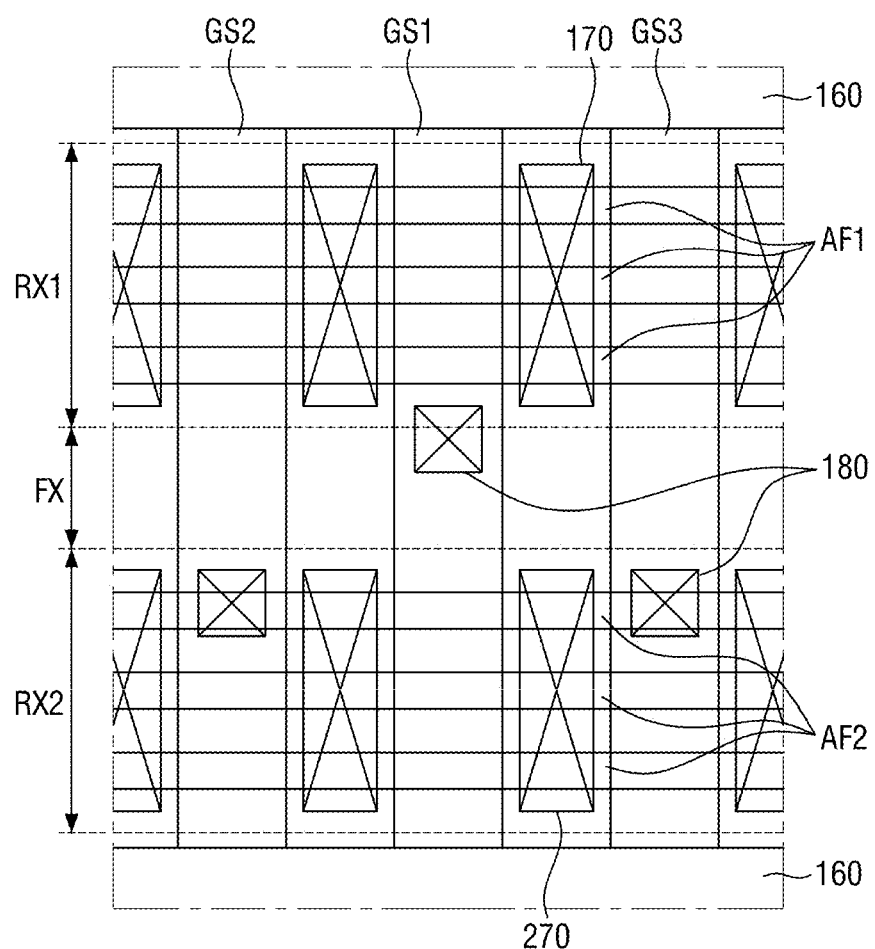
FIG. 24 is an example layout diagram for explaining the semiconductor device according to some embodiments.
Figure 25:
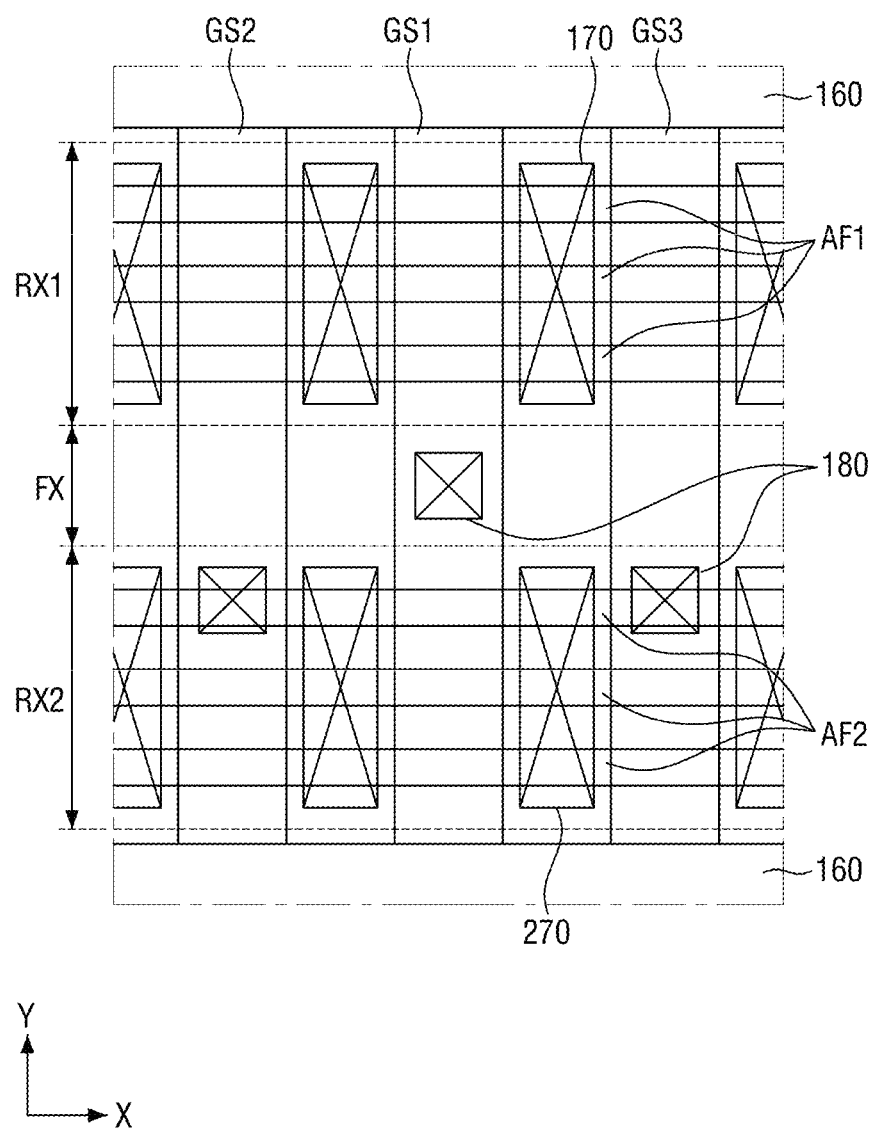
FIG. 25 is an example layout diagram for explaining the semiconductor device according to some embodiments.

FIG. 24 is an example layout diagram for explaining the semiconductor device according to some embodiments. FIG. 25 is an example layout diagram for explaining the semiconductor device according to some embodiments. For convenience of explanation, the explanation will focus on differences from those explained using FIGS. 1 to 7b.

Referring to FIG. 24, in the semiconductor device according to some embodiments, a part of the gate contact 180 may be disposed over the first active region RX1 and the field region FX. A part of the gate contact 180 may be disposed at a position that overlaps the first active region RX1.

Another part of the gate contact 180 may be disposed on the second active region RX2.

Unlike the shown case, a part of the gate contact 180 may be disposed over the second active region RX2 and the field region FX.

Referring to FIG. 25, in the semiconductor device according to some embodiments, a part of the gate contact 180 may be disposed on the field region FX. A part of the gate contact 180 may be disposed at a position that entirely overlaps the field region FX.

Unlike the shown case, at least a part of the gate contact 180 disposed at a position that overlaps the second active region RX2 may be disposed over the second active region RX2 and the field region FX.

Unlike the cases shown in FIGS. 1, 24 and 25, all the gate contacts 180 may be disposed at the position that overlaps the field region FX.

In FIGS. 1, 24 and 25, depending on the positions of the gate contact 180, each of the cross-section of the first source/drain contact 170 (the drawing taken in the second direction Y), and the cross-section of the second source/drain contact 270 may have a "T" shape rotated by 180 degrees or may have an "L" shape.

FIGS. 26 to 31 are intermediate stage diagrams for explaining a method for fabricating a semiconductor device according to some embodiments. For reference, FIGS. 26 to 31 may be fabricating process diagrams using cross-sections taken along the line C-C of FIG. 1, respectively.

Figure 26:
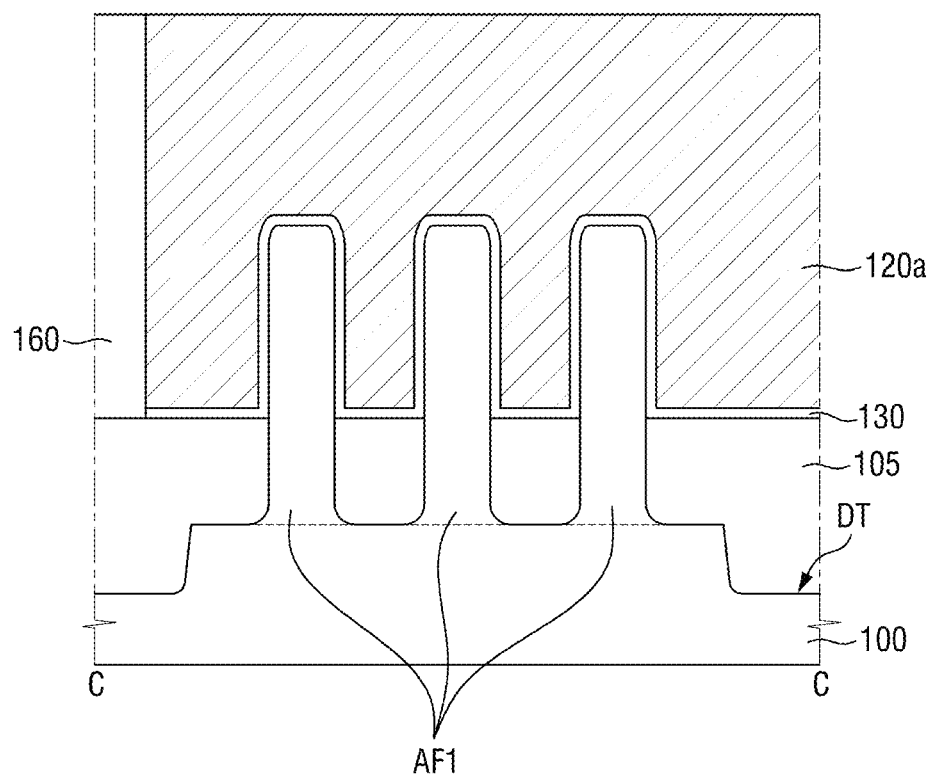
FIGS. 26 to 31 are intermediate stage diagrams for explaining a method for fabricating a semiconductor device according to some embodiments.

Referring to FIG. 26, a pre-gate electrode 120a intersecting the first active pattern AF1 is formed on the substrate 100.

A gate insulating film 130 may be disposed between the pre-gate electrode 120a and the first active pattern AF1.

After the gate insulating film 130 and the pre-gate electrode 120a are formed, a gate cut pattern 160 may be formed.

Unlike the aforementioned configuration, after forming the gate cut pattern 160, the gate insulating film 130 and the pre-gate electrode 120a may be formed. In such a case, as shown in FIG. 14b, the gate insulating film 130 may extend along the side wall of the gate cut pattern 160.

Figure 27:
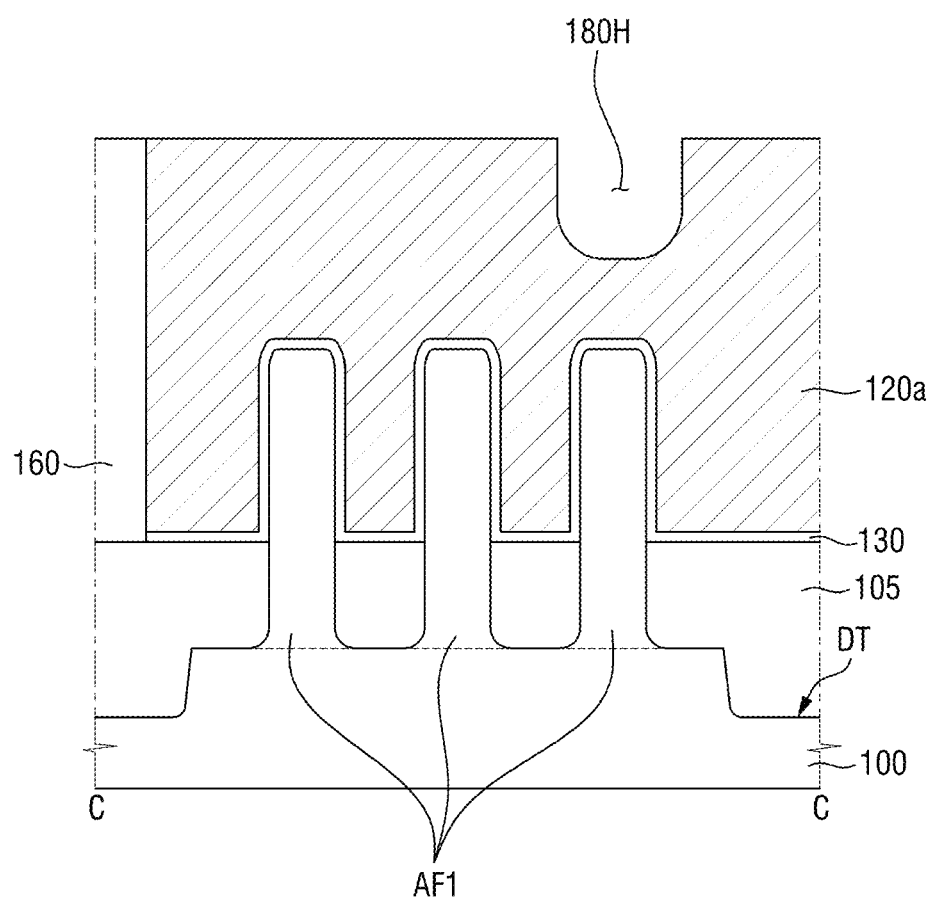

Referring to FIG. 27, a gate contact hole 180H may be formed in the pre-gate electrode 120a.

More specifically, a first mask pattern which exposes a part of the pre-gate electrode 120a may be formed on the pre-gate electrode 120a. A part of the pre-gate electrode 120a may be etched, using the first mask pattern. Therefore, a gate contact hole 180H may be formed. After forming the gate contact hole 180H, the first mask pattern may be removed.

In the cross-section as in FIG. 2 taken in the first direction X, the gate contact hole 180H may be self-aligned by the gate spacer 140. Therefore, misalignment of the gate contact 180 to be formed thereafter with the gate electrode 120 may be limited and/or prevented.

Figure 28:
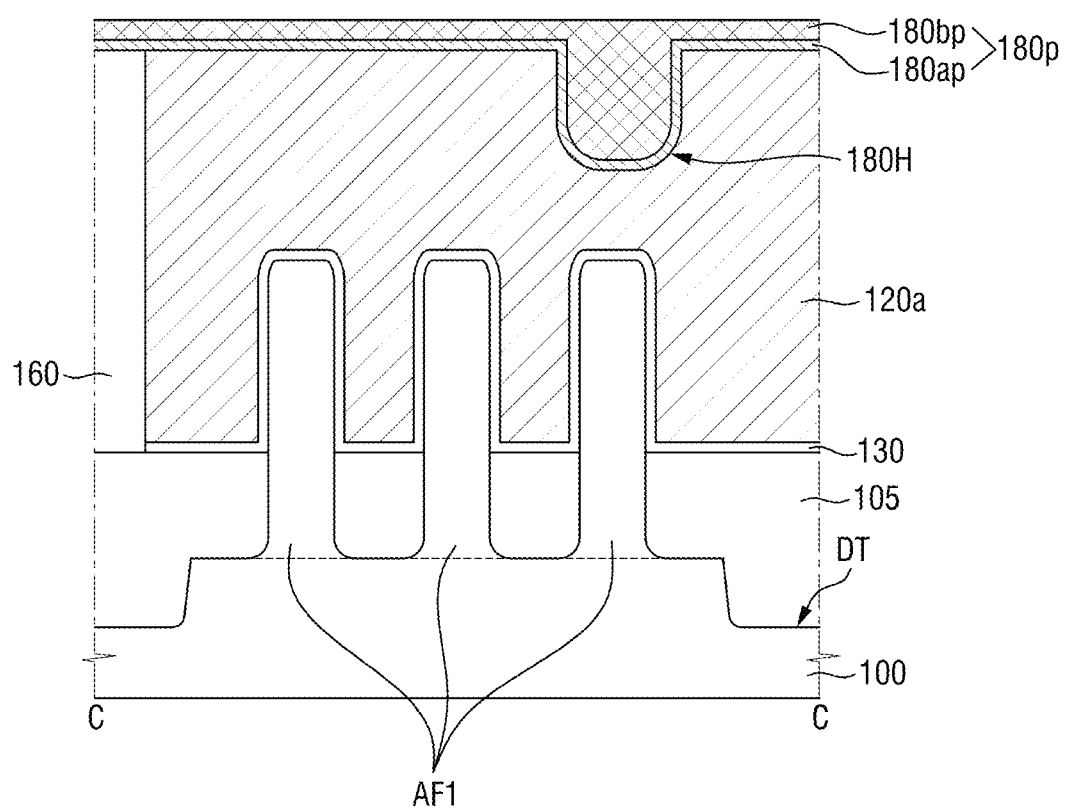

Referring to FIG. 28, a pre-gate contact 180p which fills the upper surface of the pre-gate electrode 120a and the gate contact hole 180H may be formed.

The pre-gate contact 180p may include a pre-barrier film 180ap, and a pre-filling film 180bp on the pre-barrier film 180ap. The pre-barrier film 180ap may extend along the upper surface of the pre-gate electrode 120a and the profile of the gate contact hole 180H.

Figure 29:
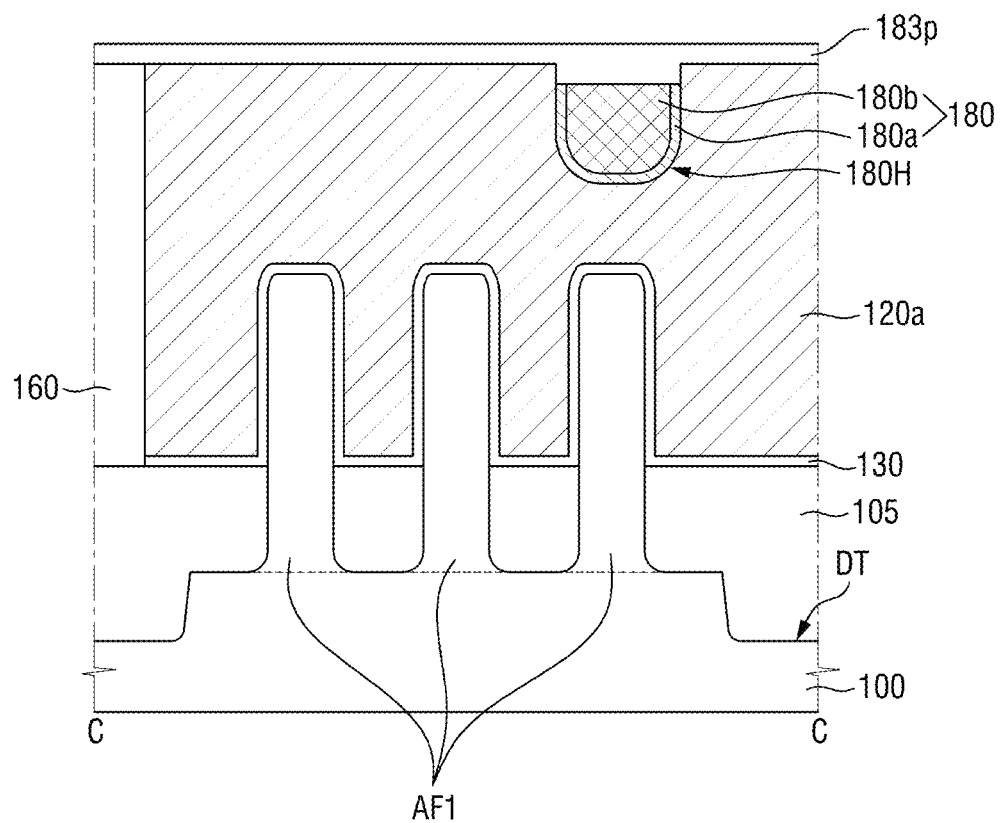

Referring to FIGS. 28 and 29, a gate contact 180 which fills at least a part of the gate contact hole 180H may be formed.

More specifically, the gate contact 180 that fills a part of the gate contact hole 180H may be formed by recessing a part of the pre-gate contact 180p. While the gate contact 180 is formed, the pre-gate contact 180p disposed on the upper surface of the pre-gate contact 180p may be removed.

Further, the upper surface of the gate contact 180 may be recessed toward the substrate 100 beyond the upper surface of the pre-gate electrode 120a.

Subsequently, a contact capping film 183p which fills the remainder of the gate contact hole 180H and covers the upper surface of the pre-gate electrode 120a may be formed.

Figure 30:
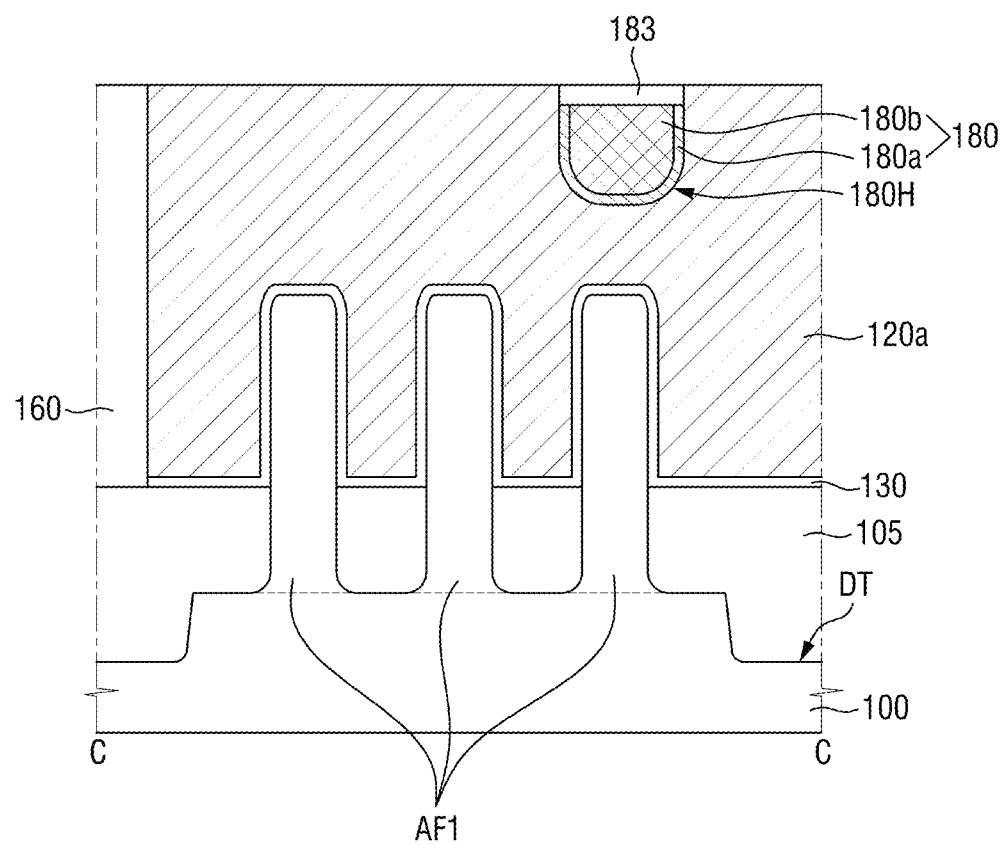

Referring to FIG. 30, by removing the contact capping film 183p which covers the upper surface of the pre-gate electrode 120a, the gate contact capping film 183 which fills the remainder of the gate contact hole 180H may be formed.

The gate contact 180 and the gate contact capping film 183 may be formed in the gate contact hole 180H.

Figure 31:
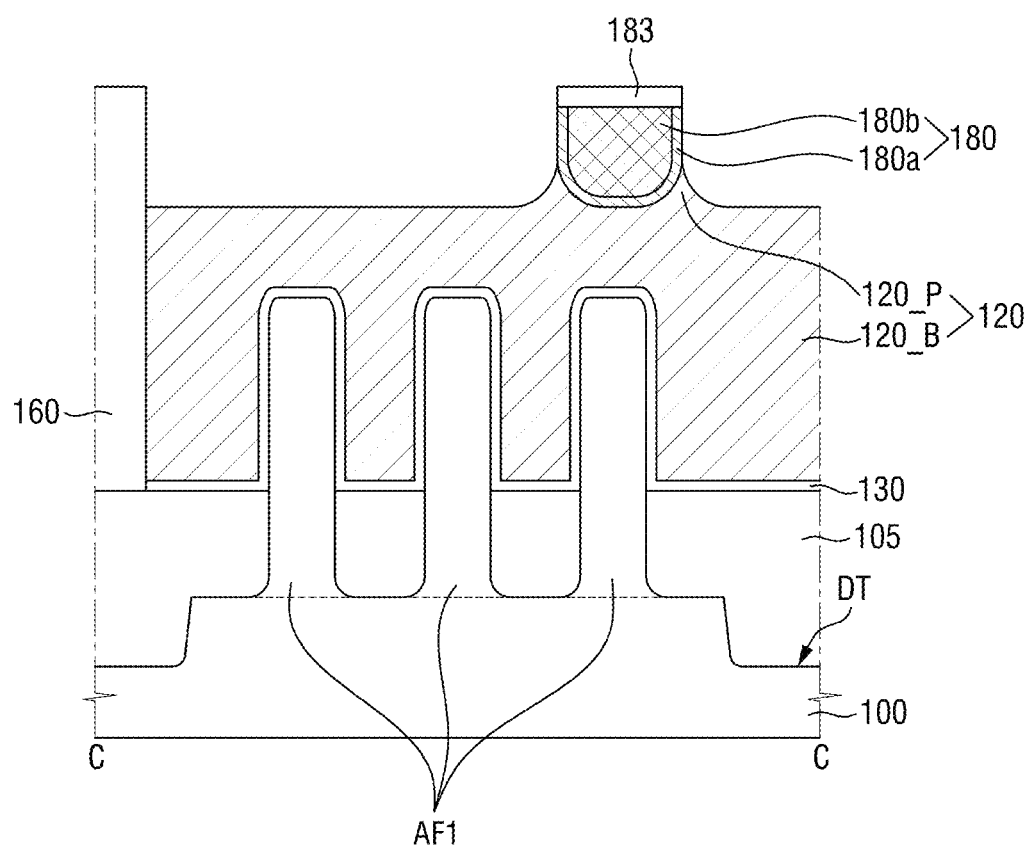

Referring to FIG. 31, the pre-gate electrode 120a may be partially removed, using the gate contact 180 and the gate contact capping film 183 as masks. A part of the pre-gate electrode 120a may be recessed to form the gate electrode 120.

Subsequently, referring to FIG. 4A, a gate capping pattern 145 may be formed on the gate electrode 120.

Also, after forming the gate capping pattern 145, the first source/drain contact (170 of FIG. 5) may be formed.

Subsequently, a wiring structure 210 directly connected to the gate contact 180 may be formed.

As an example, the gate contact capping film 183 may be removed in the process of forming the gate capping pattern 145. As another example, the gate contact capping film 183 may be removed in the process of forming the first source/drain contact 170. As still another example, the gate contact capping film 183 may not be removed and may remain on the gate contact 180.

Although FIG. 31 shows that a part of the gate cut pattern 160 is not etched while forming the gate electrode 120, inventive concepts is not limited thereto. Unlike the shown case, a part of the gate cut pattern 160 may be removed while forming the gate electrode 120. In such a case, as shown in FIG. 17, the gate capping pattern 145 may cover the upper surface of the gate cut pattern 160.

Figure 32:
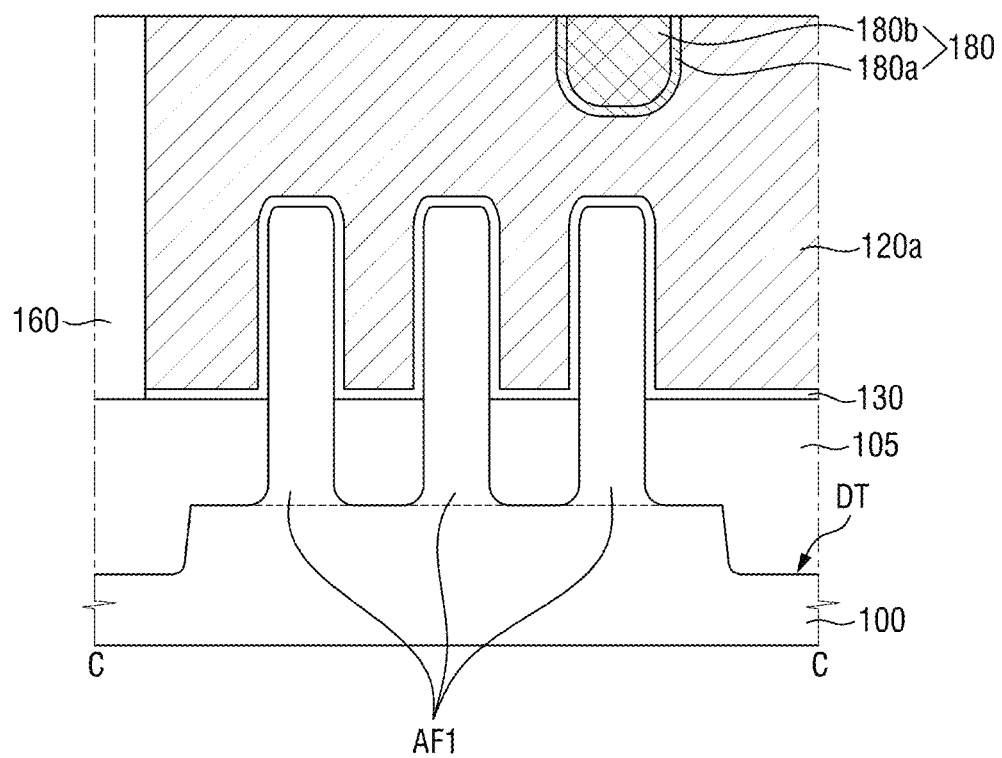
FIG. 32 is an intermediate stage diagram for explaining the method for fabricating the semiconductor device according to some embodiments.

FIG. 32 is an intermediate stage diagram for explaining the method for fabricating a semiconductor device according to some embodiments. For reference, FIG. 32 may be a process performed subsequent to FIG. 28.

Referring to FIG. 32, a gate contact 180 that entirely fills the gate contact hole 180H may be formed.

The gate contact 180 may be formed by removing the pre-gate contact 180p disposed on the upper surface of the pre-gate electrode 120a.

While some embodiments of inventive concepts have been described, the embodiments described herein should be considered in a descriptive sense only and not for purposes of limitation. Those skilled in the art will appreciate that many variations and modifications in form and detail may be made without substantially departing from the sprit and scope of inventive concepts as defined in the following claims.

What is claimed is:

1. A semiconductor device comprising:
   a substrate;
   a gate structure on the substrate, the gate structure including a gate electrode extending in a first direction, a gate capping pattern on the gate electrode, and a gate spacer on a sidewall of the gate electrode extending in the first direction, the gate electrode including a protrusion, the first direction extending parallel to an upper surface of the substrate; and
   a gate contact in the gate structure and connected to the gate electrode, the gate contact positioned so the protrusion extends along a boundary between the gate contact and the gate capping pattern,
   wherein the gate capping pattern overlaps the protrusion in the first direction,
   wherein an inner wall of the protrusion is in contact with the gate contact, and
   wherein at least a part of the gate contact in the gate structure is in contact with the gate spacer.

2. The semiconductor device of claim 1, wherein the protrusion of the gate electrode covers at least a part of a side wall of the gate contact.

3. The semiconductor device of claim 2, wherein
   the side wall of the gate contact includes a first portion covered with the protrusion of the gate electrode and a second portion covered with the gate capping pattern.

4. The semiconductor device of claim 1, wherein
   the gate capping pattern includes a lower surface facing the substrate,
   the gate capping pattern includes an upper surface that is opposite the lower surface of the gate capping pattern, and
   an upper surface of the gate contact does not protrude upward from the upper surface of the gate capping pattern.

5. The semiconductor device of claim 1, further comprising:
   a wiring structure on the gate contact, wherein
   the wiring structure includes a via and a wiring pattern connected to the via, and
   the via is directly connected to the gate contact.

6. The semiconductor device of claim 1, wherein
   the protrusion of the gate electrode includes a first side wall facing the gate contact and a second side wall opposite the first side wall, and
   the first side wall of the protrusion of the gate electrode includes a curved surface.

7. The semiconductor device of claim 6, wherein a height of the first side wall of the protrusion of the gate electrode is the same as a height of the second side wall of the protrusion of the gate electrode.

8. The semiconductor device of claim 6, wherein a height of the first side wall of the protrusion of the gate electrode is greater than a height of the second side wall of the protrusion of the gate electrode.

9. The semiconductor device of claim 6, wherein a height of the first side wall of the protrusion of the gate electrode is smaller than a height of the second side wall of the protrusion of the gate electrode.

10. The semiconductor device of claim 1, wherein
    the gate structure includes a gate contact hole,
    the gate contact includes a contact barrier film and a contact filling film,
    the contact barrier film extends along a profile of the gate contact hole, and
    the contact filling film fills the gate contact hole on the contact barrier film.

11. The semiconductor device of claim 10, wherein the contact barrier film includes at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and a two-dimensional (2D) material.

12. The semiconductor device of claim 1, wherein
    the substrate includes a multi-channel active pattern,
    the multi-channel active pattern extends in a second direction,
    the gate structure intersects the multi-channel active pattern, and
    the second direction crosses the first direction and extends parallel to the upper surface of the substrate.

13. The semiconductor device of claim 1, wherein
    the gate structure includes a gate insulating film between the substrate and the gate electrode, and
    the gate insulating film includes boron nitride.

14. A semiconductor device comprising:
a substrate including an active region and a field region,
the substrate including a multi-channel active pattern in the active region, the multi-channel active pattern extending in a first direction;
a gate structure intersecting the multi-channel active pattern,
the gate structure including a gate electrode extending in a second direction, a gate capping pattern extending along an upper surface of the gate electrode, and a gate spacer on a side wall of the gate electrode extending in the second direction,
the gate electrode including a protrusion including an inner wall and an outer wall,
the inner wall of the protrusion having a concave shape, the outer wall being defined along a periphery of the inner wall;
a source/drain pattern adjacent to at least one side of the gate structure and connected to the multi-channel active pattern;
a gate contact on the active region of the substrate and connected to the gate electrode, at least a part of the gate contact being in a pocket defined by the inner wall of the protrusion of the gate electrode; and
a source/drain contact on the active region of the substrate and connected to the source/drain pattern, and
wherein the inner wall is contact with the gate contact,
wherein the outer wall is contact with the gate capping pattern, and
wherein at least a part of the gate contact is in contact with the gate spacer.

15. The semiconductor device of claim 14, wherein an outer wall of the protrusion of the gate electrode borders the gate spacer and the gate capping pattern.

16. The semiconductor device of claim 14, wherein the protrusion of the gate electrode extends up to an upper surface of the gate contact.

17. The semiconductor device of claim 14, further comprising:
a wiring structure on the gate structure, wherein
wherein the wiring structure includes a via and a wiring pattern connected to the via, and
the via is directly connected to the gate contact.

18. The semiconductor device of claim 14, wherein the protrusion of the gate electrode extends in a thickness direction of the substrate.

19. The semiconductor device of claim 18, wherein the inner wall of the protrusion of the gate electrode directly joins the outer wall of the protrusion of the gate electrode.

20. The semiconductor device of claim 14, wherein an upper surface of the gate contact is level with an upper surface of the gate capping pattern.

* * * * *